(12) United States Patent
Hidaka

(10) Patent No.: US 6,813,199 B2
(45) Date of Patent: Nov. 2, 2004

(54) SEMICONDUCTOR MEMORY DEVICE WITH IMPROVED SAVING RATE FOR DEFECTIVE CHIPS

(75) Inventor: Hideto Hidaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 128 days.

(21) Appl. No.: 10/330,071

(22) Filed: Dec. 30, 2002

(65) Prior Publication Data

US 2004/0004866 A1 Jan. 8, 2004

(30) Foreign Application Priority Data

Jul. 3, 2002 (JP) ........................................ 2002-194597

(51) Int. Cl.$^7$ ............................ G11C 7/00; G11C 14/00; G11C 16/06; G11C 8/00; G11C 29/00
(52) U.S. Cl. ............. 365/200; 365/185.08; 365/185.23; 365/189.03; 365/189.05; 365/189.07; 365/189.11; 365/230.03; 365/230.06; 365/230.08
(58) Field of Search .......................... 365/200, 185.23, 365/230.03, 230.08

(56) References Cited

U.S. PATENT DOCUMENTS

| | | | |
|---|---|---|---|
| 4,918,692 A | | 4/1990 | Hidaka et al. |
| 5,848,003 A | * | 12/1998 | Nishikawa .................. 365/200 |
| 6,041,006 A | * | 3/2000 | Tsuchiya .................... 365/210 |
| 6,144,592 A | * | 11/2000 | Kanda ........................ 365/200 |
| 6,542,419 B2 | * | 4/2003 | Hasegawa ................... 365/200 |
| 2002/0012282 A1 | * | 1/2002 | Saito et al. ................ 365/200 |
| 2003/0026131 A1 | * | 2/2003 | Matarrese et al. ..... 365/185.11 |
| 2004/0062134 A1 | * | 4/2004 | Kato et al. ................. 365/232 |

FOREIGN PATENT DOCUMENTS

| | | |
|---|---|---|
| JP | 63-302497 | 12/1988 |
| JP | 2002-50192 | 2/2002 |

* cited by examiner

Primary Examiner—David Nelms
Assistant Examiner—Ly Duy Pham
(74) Attorney, Agent, or Firm—Burns, Doane, Swecker & Mathis, L.L.P.

(57) ABSTRACT

A spare column on which spare memory cells are arranged is provided in a memory cell array. In the memory cell array, address assignment can be altered so that sub-word lines selected collectively according to the same row address is divided into the right and left halves. The alteration in assignment can be realized by disconnecting a fuse element incorporated in a SD generating circuit. Even in a case where a plurality of defective memory cells are concentrated on the same memory cell row, the number of defective memory cells in a select unit corresponding to row address can be altered by alteration in address assignment so as to be reduced as a result of distribution; thereby enabling increase in number of chips that can be saved with spare memory cells. Accordingly, improvement on saving rate for defective chips can be realized without increasing the number of spare memory cells.

10 Claims, 25 Drawing Sheets

US 6,813,199 B2

SEMICONDUCTOR MEMORY DEVICE WITH IMPROVED SAVING RATE FOR DEFECTIVE CHIPS

BACKGROUND OF THE INVENTION

1. Field of the Invention

The present invention relates to a semiconductor memory device, and more particularly to a semiconductor memory device including a memory cell array in which replacement with a spare memory cell can be performed.

2. Description of the Background Art

In recent years, increased acceleration has progressed toward higher integration in semiconductor memory devices. Generally, a highly integrated semiconductor memory device is provided with spare memory cells and even in a case where a defect arises in part of memory cells in a fabrication stage, a defective memory cell having the defect therein is replaced with a spare memory cell to save one bit. A method with such redundancy replacement applied has generally been used, in which a product yield is improved.

Along with development on the scale of a semiconductor memory device, however, firstly an increase occurs in number of elements each including a spare memory cell, which are necessary to raise a product yield, and with such an increase, an increase also occurs in number of program elements for storing an address of a defective memory cell to be replaced with a spare memory cell. Such increases in the elements have entailed a problem of an increased chip area.

In order to perform the replacement, a necessity arises for storing an address of a defective memory cell in a non-volatile manner. As such means, used in many cases are program elements such as a fuse element. This fuse element is disconnected using a laser beam or the like means. In order to achieve not only sure disconnection but no damage to an element in the neighborhood thereof either, it is required that a fuse element has a size of some magnitude and no other element is present therearound. Therefore, a chip area becomes larger with more of program elements installed.

Besides, secondly, with an increase in number of program elements, a program time for saving a defective chip cannot be neglected, having further resulted in a problem of increase in a fabrication cost.

SUMMARY OF THE INVENTION

It is an object of the present invention to provide a semiconductor memory device with an improved saving rate for defective chips caused by defective memory cells.

The present invention is, being summarized, a semiconductor memory device which includes: first to fourth normal memory cell groups; first and second spare memory cells; a first select circuit; and a second select circuit.

The first to fourth normal memory cell groups each include a plurality of normal memory cells.

The first and second spare memory cells are each substituted for a defective memory cell among the plurality of normal memory cells.

The first select circuit holds address assignment information in a non-volatile manner. The first select circuit selects two normal memory cell groups among the first to fourth normal memory cell groups determined on the basis of the address assignment information together with the first spare memory cell in response to a first address value given as an input address. The first select circuit selects the other two normal memory cell groups among the first to fourth normal memory cell groups determined on the basis of address assignment information together with the second spare memory cell in response to a second address value given as an input address.

The second select circuit holds replacement information in a non-volatile manner. The second select circuit selects the first spare memory cell on the basis of the replacement information instead of a first defective memory cell among normal memory cells selected according to the first address value. The second select circuit selects the second spare memory cell on the basis of the replacement information instead of a second defective memory cell among normal memory cells selected according to the second address value.

Accordingly, a main advantage of the present invention is that a saving rate for defective chips with spare memory cells can be improved while suppressing an increase in number of spare memory cells.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
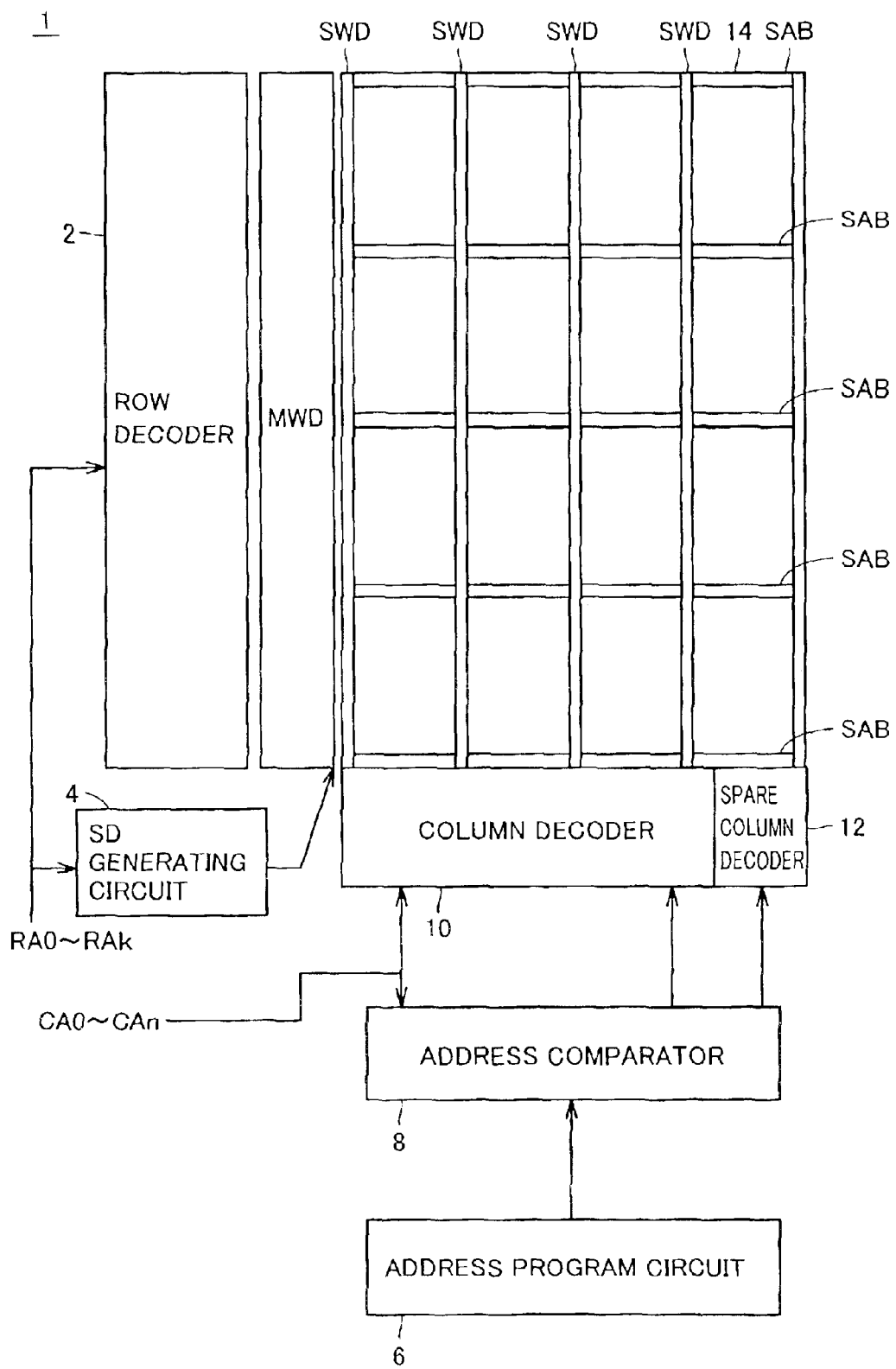
FIG. 1 is a schematic block diagram showing a configuration of a semiconductor memory device 1 according to a first embodiment of the present invention.

Detailed description will be given of embodiments of the present invention below with reference to the accompanying drawings. Note that the same reference numerals in the figures represent the same or corresponding components.

First Embodiment

FIG. 1 is a schematic block diagram showing a configuration of a semiconductor memory device 1 according to a first embodiment of the present invention.

Referring to FIG. 1, semiconductor memory device 1 includes: a row decoder 2 receiving row address signals RA0 to RAk to select a memory cell row; a main word driver MWD driving a main word line according to an output of row decoder 2; and an SD generating circuit 4 receiving row address signals RA0 to RAk to output signals SD10 to SD21.

Semiconductor memory device 1 further includes: an address program circuit 6 storing an address to be replaced corresponding to a defective memory cell in a non-volatile manner; an address comparator comparing an output of address program circuit 6 with column address signal CA0 to CAn; a column decoder 10 performing selection of a memory cell column according to column address signal CA0 to CAn whose active state is determined according to an output of address comparator 8; a spare column decoder 12 for selecting a spare memory cell column according to an output of address comparator 8; and a memory cell array 14.

In memory cell array 14, a row and a column are selected according to outputs of row decoder 2, column decoder 10 and spare column decoder 12 and data transmission/reception to/from outside is performed. Memory cell array 14 includes sub-word driver bands SWD and sense amplifier bands SAB, and is divided into a plurality of memory blocks partitioned in a lattice with sub-word driver bands SWD and sense amplifier bands SAB.

Semiconductor memory device 1 performs selection of a memory cell row as a first stage with row decoder 2, sub-word driver SWD and SD generating circuit 4 and further performs selection of a memory cell column as a second stage with address program circuit 6, address comparator 8, column decoder 10 and spare column decoder 12. On column selection at the second stage, there is performed substitution of a spare memory cell for a normal memory cell.

Figure 2:
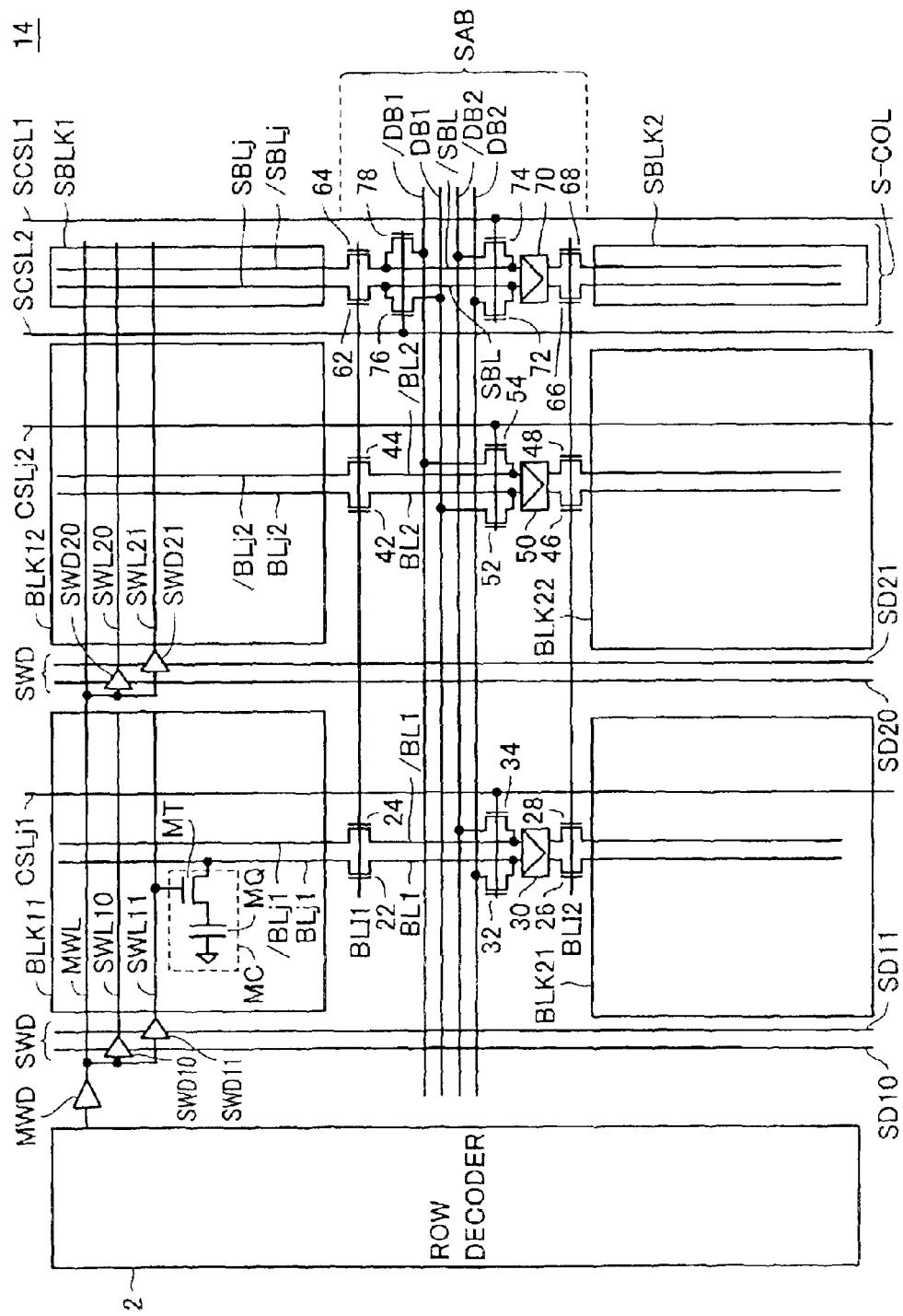
FIG. 2 is a circuit diagram schematically showing a configuration of a memory cell array 14.

FIG. 2 is a circuit diagram schematically showing a configuration of memory cell array 14. Note that row decoder 2 and main word driver MWD are also shown in the figure for the sake of description.

Referring to FIG. 2, memory cell array 14 includes: sub-word driver bands SWD; sense amplifier bands SAB; and memory blocks BLK11, BLK12, BLK21 and BLK22.

Sub-word driver band SWD includes: a sub-word driver SWD10 driving a sub-word line SWL10 according to an output of main ward driver MWD; and a sub-word driver SWD11 driving a sub-word line SWL11 according to an output of main word driver MWD. Sub-word drivers SWD10 and SWD11 are provided correspondingly to memory block BLK11. Sub-word drivers SWD10 and SWD11 are activated according to respective signals SD10 and SD11.

Memory cell array 14 further includes: a sub-word driver SWD20 driving a sub-word line SWL20 according to an output of main driver MWD; and a sub-word driver SWD21 driving a sub-word line SWL21 according to an output of main word driver MWD. Sub-word drivers SWD20 and SWD21 are provided correspondingly to memory block BLK12. Sub-word drivers SWD20 and SWD21 are activated according to respective signals SD20 and SD21.

A configuration in which a plurality of sub-word lines are provided to each memory block, being branched from main word line MWL, is referred to as a hierarchical word line configuration.

Generally, a memory cell MC includes: a capacitor MQ for accumulating a charge connected between a cell plate and a storage node; and an access transistor MT connected between the storage node and a bit line, and whose gate is connected to a sub-word line. A sub-word line is connected to the gates of many of access transistors aligned on one row. Therefore, since a sub-word line is usually made of polysilicon, which is the same material as a gate, it is an interconnection high in resistivity.

If such a sub-word line high in resistivity is long, it takes a time to activate all of memory cells on a row. A feature of a hierarchical word line configuration is that sub-word lines divided shorter in length are used so that the memory cells are able to be driven by a main word line low in resistance at high speed.

Memory cell array 14 further includes: a spare memory block SBLK1 disposed adjacent to memory block BLK12, and sharing sub-word lines SWL20 and SWL21 therewith; and a spare memory block SBLK2 disposed adjacent to memory block BLK22, and sharing sub-word lines therewith.

While a plurality of bit line pairs are provided to each of memory blocks BLK11 and BLk12, bit lines BLj1, /BLj1, BLj2 and /BLj2 are as representatives shown in the figure. Bit lines SBLj and /SBLj to which spare memory cells are connected are provided to spare memory block SBLK1.

Sense amplifier band SAB includes: an N-channel MOS transistor 22 connecting bit line BLj1 and bit line BL1 to each other according to signal BLI1; and an N-channel MOS transistor 24 connecting bit line /BLj1 and bit line /BL1 to each other.

Sense amplifier band SAB further includes: an N-channel MOS transistor 26 connecting bit line BL1 to a corresponding bit line of memory block BLK21 according to signal BLI2; and an N-channel MOS transistor 28 connecting bit line /BL1 to a corresponding bit line of memory block BLK21 according to signal BLI2.

Sense amplifier band SAB further includes: a sense amplifier 30 amplifying a potential difference generated between bit lines BL1 and /BL1; an N-channel MOS transistor 32 becoming conductive according to activation of a column select line CSLj1 to connect bit line BL1 and a data line DB2 to each other; and an N-channel MOS transistor 34 connecting bit line /BL1 and data line /DB2 to each other according to activation of column select line CSLj1. Sense amplifier band SAB further includes: an N-channel MOS transistor 42 connecting bit line BLj2 and bit line BL2 to each other according to activation of signal BLI1; and an N-channel MOS transistor 44 connecting bit line /BLj2 and bit line /BL2 to each other according to activation of signal BLI1.

Sense amplifier band SAB further includes: an N-channel MOS transistor 46 connecting bit line BL2 to a corresponding bit line of memory block BLK22 according to a signal BLI2; and an N-channel MOS transistor 48 connecting bit line /BL2 to a corresponding bit line of memory block BLK22 according to a signal BLI2.

Sense amplifier band SAB further includes: a sense amplifier 50 amplifying a potential difference generated between bit lines BL2 and /BL2; an N-channel MOS transistor 52 becoming conductive according to activation of a column select line CSLj2 to connect bit line BL2 and a data line DB1 to each other; and an N-channel MOS transistor 54 connecting bit line /BL2 and data line /DB1 to each other according to activation of column select line CSLj2.

Sense amplifier band SAB further includes: an N-channel MOS transistor 62 connecting bit line SBLj and bit line SBL to each other according to activation of signal BLI1; and an N-channel MOS transistor 64 connecting bit line /SBLj and bit line /SBL to each other according to activation of signal BLI1.

Sense amplifier band SAB further includes: an N-channel MOS transistor 66 connecting bit line SBL and a corresponding bit line of memory block SBLK2 to each other according to signal BLI2; and an N-channel MOS transistor 68 connecting bit line /SBL and a corresponding bit line of memory block SBLK2 to each other according to signal BLI2.

Sense amplifier band SAB further includes: a sense amplifier 70 amplifying a potential difference between bit lines SBL and /SBL; an N-channel MOS transistor 76 becoming conductive according to activation of a column select line SCSL2 to connect bit line SBL and data line DB1 to each other; an N-channel MOS transistor 78 connecting bit line /SBL and data line /DB1 to each other according to activation of a column select line SCSL2; an N-channel MOS transistor 72 becoming conductive according to activation of column select line SCSL1 to connect bit line SBL and bit line DB2 to each other; and an N-channel MOS transistor 74 connecting bit line /SBL and data line /DB2 to each other according to activation of column select line SCSL1.

Figure 3:
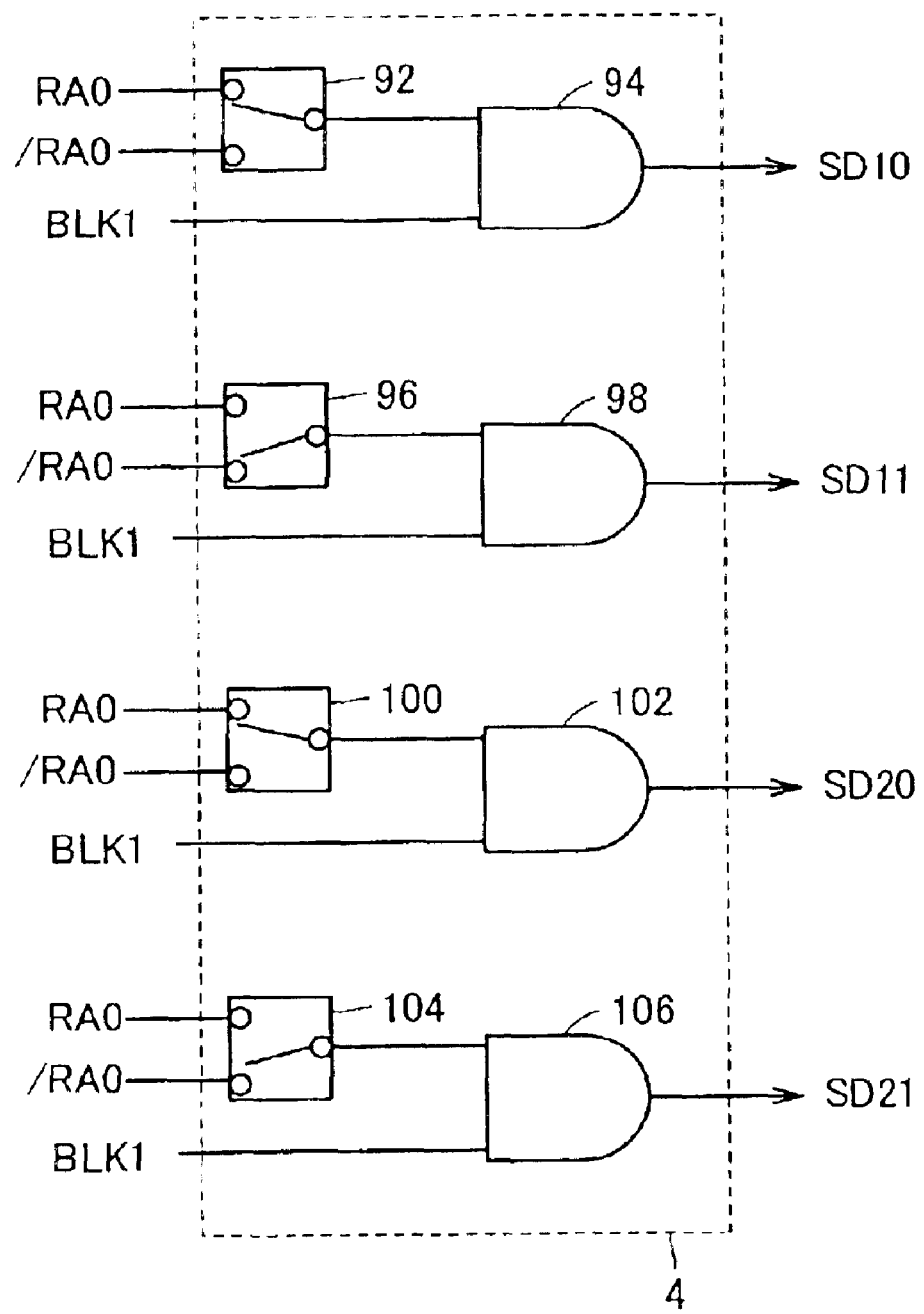
FIG. 3 is a circuit diagram showing a configuration of an SD generating circuit 4 in FIG. 1.

FIG. 3 is a circuit diagram showing a configuration of SD generating circuit 4 in FIG. 1.

Referring FIG. 3, SD generating circuit 4 includes: a switch circuit 92 selecting one of row address signal RA0 and a signal /RA0 which is an inverted signal thereof; an AND circuit 94 receiving an output of switch circuit 92 and a block select signal BLK1 to output a signal SD10; a switch circuit 96; and an AND circuit 98 receiving an output of switch circuit 96 and block select signal BLK1 to output a signal SD11.

SD generating circuit 4 further includes: a switch circuit 100; an AND circuit 102 receiving an output of switch circuit 100 and block select signal BLK1 to output signal SD20; a switch circuit 104; and an AND circuit 106 receiving an output of switch circuit 104 and block select signal BLK1 to output a signal SD21.

Note that block select signal BLK1 is a signal activating a division unit partitioned by sense amplifier bands SAB in memory cell array 14 shown in FIG. 1. Block select signal BLK1 is supplied from row decoder 2, where a row address signal is decoded to block select signal BLK1.

Though not shown, SD generating circuit 4 includes similar circuits the number of which is equal to the number of division units obtained by partitioning by sense amplifier bands SAB. A corresponding block select signal is inputted to SD generating circuit 4.

SD generating circuit 4, when address bit RA0 of a row address signal is 1, can switch between a first operation selecting sub-word lines SWL10 and SWL20 of FIG. 2 collectively and a second operation selecting sub-word lines SWL11 and SWL20 of FIG. 2 collectively. Which of the operations is performed can be programmed by fuse elements included in switch circuits 92, 96, 100 and 104.

Furthermore, by altering program contents of fuse elements included in switch circuits 92, 96, 100 and 104, alteration can also achieved so that one of the first and second operations is performed in a case where address bit RA0 of a row address signal is 0. By altering program contents of fuse elements included in switch circuits 92, 96, 100 and 104, alteration can be achieved in address assignment information indicating a way that an inputted row address is assigned to memory cells.

Sub-word drivers SWD10, SWD11, SWD20 and SWD21 perform selective driving of a sub-word line on activation of main word line MWL of FIG. 2 according to signals SD10, SD11, SD20 and SD21 outputted by SD generating circuit 4.

Figure 4:
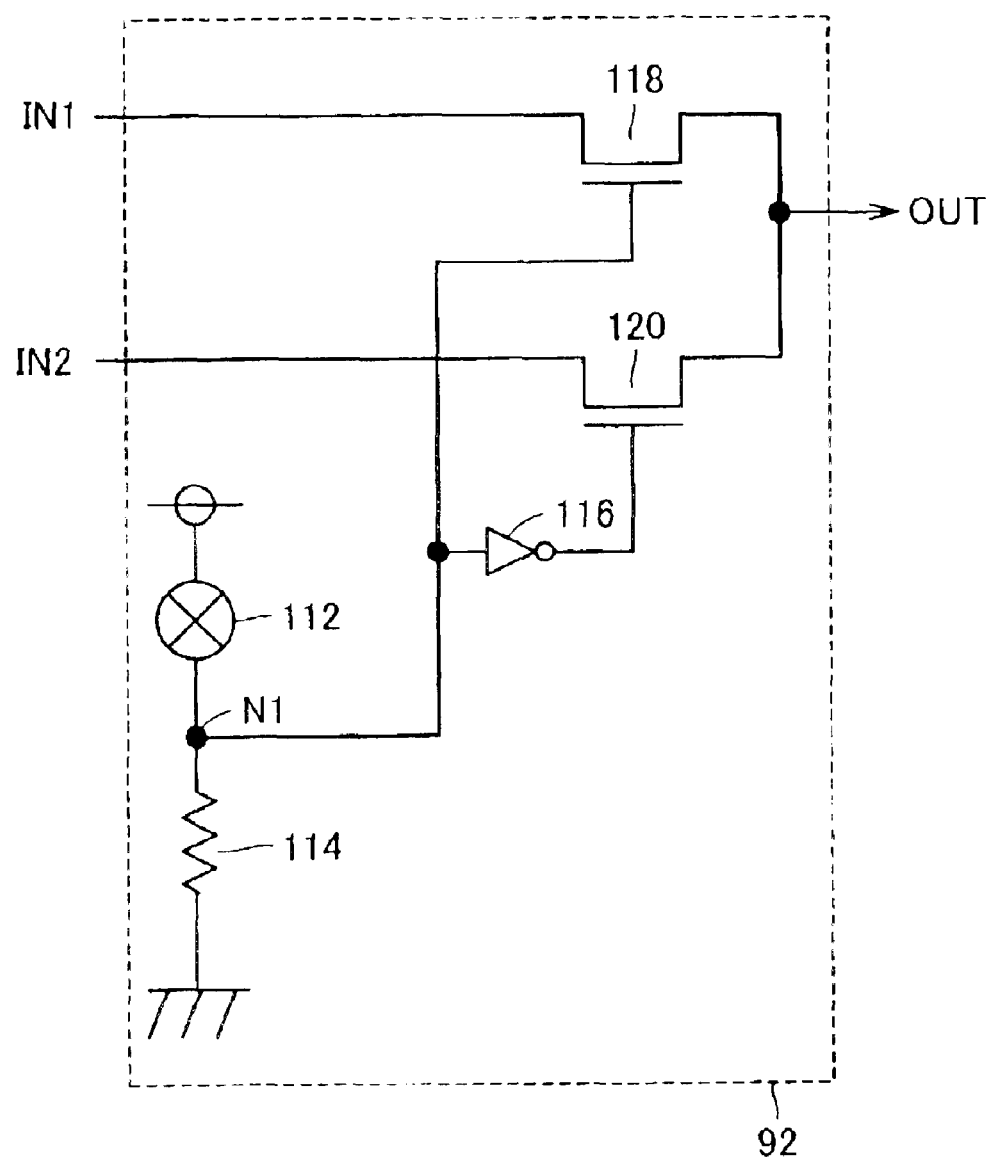
FIG. 4 is a circuit diagram showing a configuration of a switch circuit 92 in FIG. 3.

FIG. 4 is a circuit diagram showing a configuration of switch circuit 92 in FIG. 3.

Referring to FIG. 4, switch circuit 92 includes: a fuse element 112 connected between a power supply node and a node N1; a resistor 114 connected between node N1 and a ground node; an inverter 116 whose input is connected to node N1; an N-channel MOS transistor 118 connected between an input node IN1 and an output node OUT, and whose gate is connected to node N1; and an N-channel MOS transistor 120 connected between an input node IN2 and output node OUT, and receiving an output of inverter 116 at the gate thereof.

Note that since each of switch circuits 96, 100 and 104 of FIG. 3 is of a configuration similar to switch circuit 92, no description thereof will be repeated.

Description will be given of operations in the semiconductor memory device of the first embodiment below.

Figure 5:
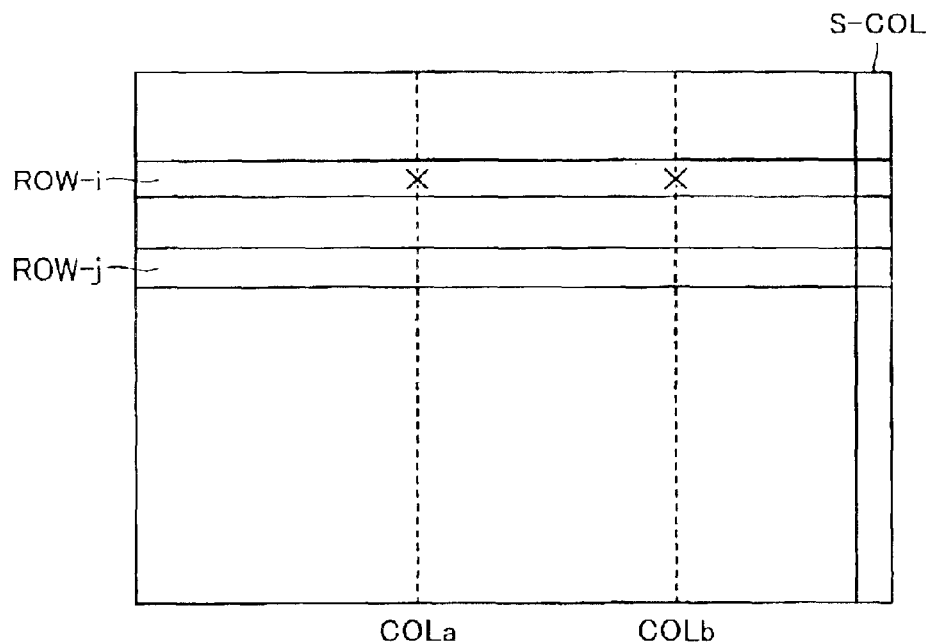
FIG. 5 is a diagram for describing arrangement of defective memory cells replaceable according to the present invention, but not replaceable in a conventional practice.

FIG. 5 is a diagram for describing arrangement of defective memory cells replaceable according to the present invention, but not replaceable in a conventional practice.

Referring to FIG. 5, provided to a normal memory region is a spare column S-COL, in which spare memory cells are provided. Herein, the diagram expresses a logical address space of a memory cell array.

Herein, consideration is given to a case where defective memory cells are present at column addresses COLa and COLb in a region designated by row address ROW-i. In this case, it is assumed that no defective memory cell is present in a region designated by row address ROW-j. Only one spare memory cell is assumed to be arranged on each row of spare column S-COL.

In a conventional practice, in a case where two defective memory cells were present on one memory cell row as shown in FIG. 5, no saving by replacement was not able to be performed. The region designated by row address ROW-i was selected collectively by activation of the memory cell row. The reason for the no saving by replacement is that only one spare memory cell is assigned to each select unit.

Figure 6:
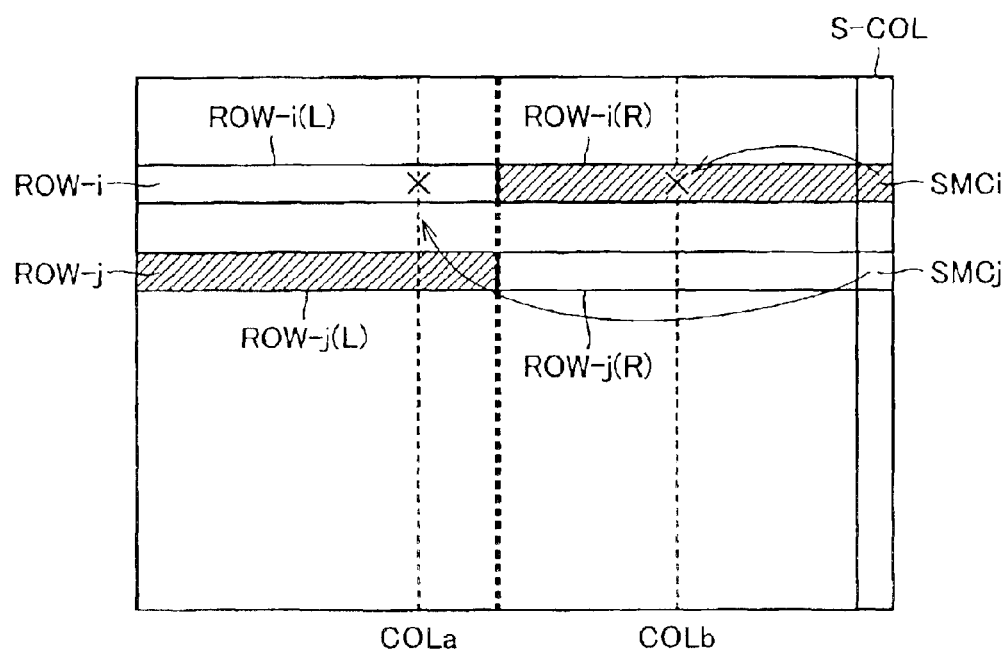
FIG. 6 is a diagram for describing replacement of a memory cell performed in the first embodiment of the present invention.

FIG. 6 is a diagram for describing replacement of a memory cell performed in the first embodiment of the present invention.

Referring to FIG. 6, if address assignment to the right and left halves of a memory cell array is altered therebetween with respect to an arrangement of memory cells selected simultaneously by row address ROW-i, even defects as shown in FIG. 5 can be saved. That is, by altering settings in switch circuits 92, 96, 100 and 104 of the SD generating circuit shown in FIG. 3, address assignment can be altered.

To be concrete, in a normal mode, memory regions ROW-i (L) and ROW-i (R) and spare memory cell SMCi are collectively activated in correspondence to row address ROW-i. Memory regions ROW-j (L) and ROW-j (R) and spare memory cell SMCj are collectively activated in correspondence to row address ROW-j, which is different from row address ROW-i.

In contrast to this, in a case where totally two defective memory cells are present one in each of right and left halves of the same and one row of a memory cell array, defects in such a situation can be saved by altering address assignment.

To be concrete, internal setting of the SD generating circuit of FIG. 1 is altered in such a manner that memory regions ROW-i (L) and ROW-j (R) and spare memory cell SMCj are collectively activated in correspondence to row address ROW-i. Then, it is only required that a replacement address is set in address program circuit 6 of FIG. 1 so that a defective memory cell present on column address COLa in memory region ROW-i (L) is replaced with spare memory cell SMCj.

Furthermore, internal setting of the SD generating circuit of FIG. 1 is altered in such a manner that memory regions ROW-j (L) and ROW-i (R) and spare memory cell SMCi are collectively activated in correspondence to row address ROW-j. In this case, it is only required that a replacement address is set in address program circuit 6 of FIG. 1 so that a defective memory cell present on column address COLb in memory region ROW-i (R) is replaced with spare memory cell SMCi.

Such address replacement can be realized by alteration of setting in switch circuits 92, 96, 100 and 104 of the SD generating circuit shown in FIG. 3. For example, the address replacement can be realized by that switch circuit 100 is altered in its setting so as to output row address /RA0 and switch circuit 104 is altered in its setting so as to output row address RA0.

As described above, in the semiconductor memory device shown in the first embodiment, alteration can be made in assignment of addresses inputted externally to a plurality of normal memory cells. Thereafter, by replacing defective memory cells with spare memory cells, saving can be performed of a chip that, in a conventional practice, was not able to be saved because of concentration in location of defective memory cells to a specific portion. Thereby, more of improvement on a product yield can be realized compared with that in a conventional case.

Example Modification of First Embodiment

Figure 7:
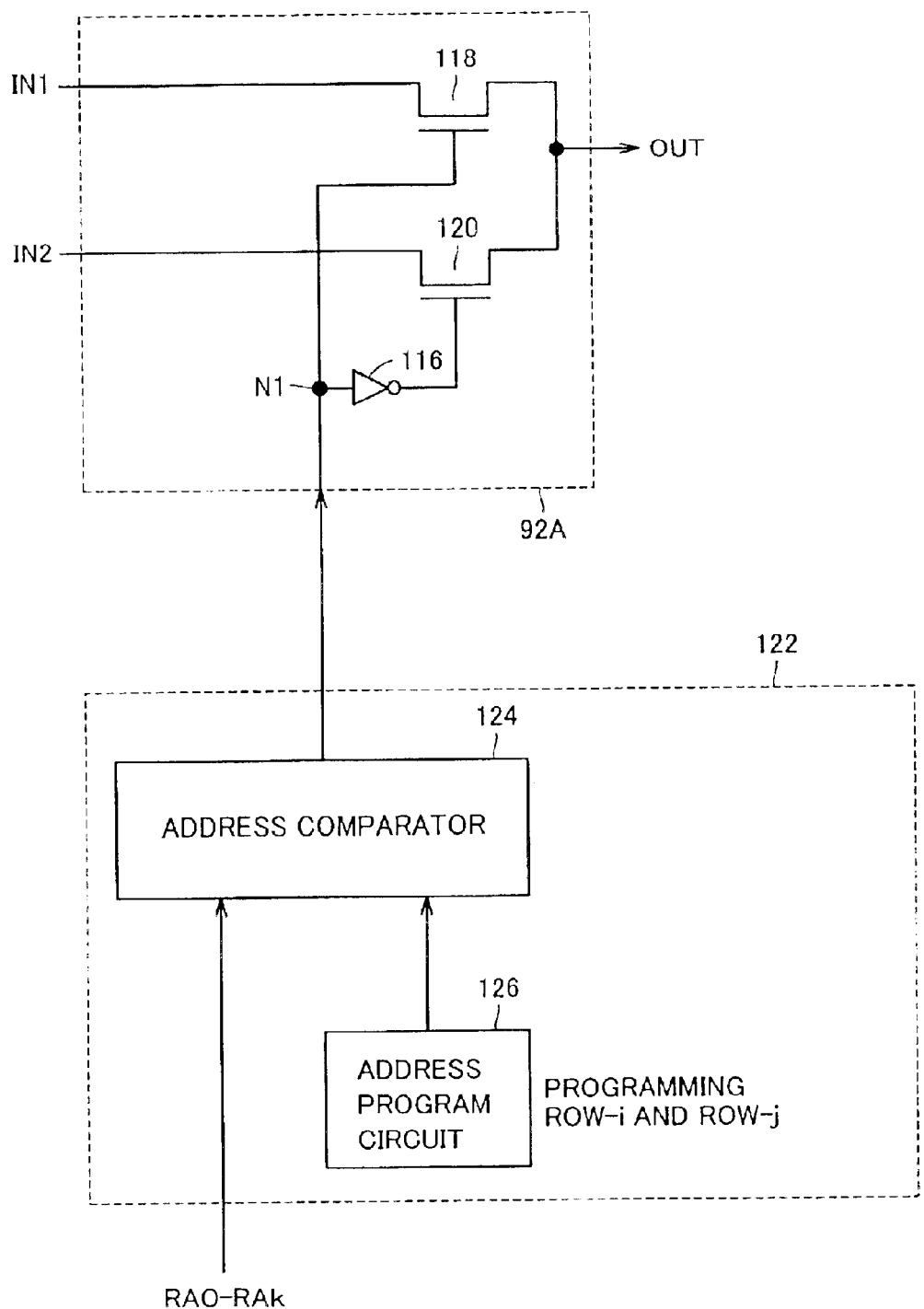
FIG. 7 is a circuit diagram for describing an example modification of the first embodiment.

FIG. 7 is a circuit diagram for describing an example modification of the first embodiment.

Referring to FIG. 7, in the example modification of the first embodiment, a switch circuit 92A is used instead of switch circuit 92 shown in FIG. 4. Switch circuit 92A is of a configuration obtained after fuse element 112 and resistor 114 are removed from switch circuit 92 shown in FIG. 4. A control signal is given to node N1 of switch circuit 92A from an address switch control circuit 122.

Address switch control circuit 122 includes: an address program circuit 126 in which row addresses ROW-i and ROW-j are programmed; and an address comparator 124 comparing an output of address program circuit 126 with row address signals RA0 to RAk.

Row address ROW-i is an address corresponding to a row on which a plurality of defects of FIG. 6 are present and replacement is disabled without any alteration in address assignment. Row address ROW-j is an address corresponding to a row the right half of which is used as a substitute for part of the former row.

Address comparator 124 performs address replacement only when an address programmed in address program circuit 126 coincides with a row address signal inputted externally.

Note that in a case where the right half of a region corresponding to row address ROW-i is subjected to address replacement, a substitutable region is limited in more of cases. In such a case, in an address program circuit, no necessity arises for programming row address ROW-J. To be concrete, for example, it is only required that the lowest 1 bit of row address ROW-i is neglected and address comparator 124 detects the presence or absence of a substitute.

Second Embodiment

The first embodiment relates to the invention to further improving a defect saving rate in a case where a spare column is provided in a memory cell array. The second embodiment can improve a defect saving rate in a case where a spare I/O is provided in a memory cell array.

Figure 8:
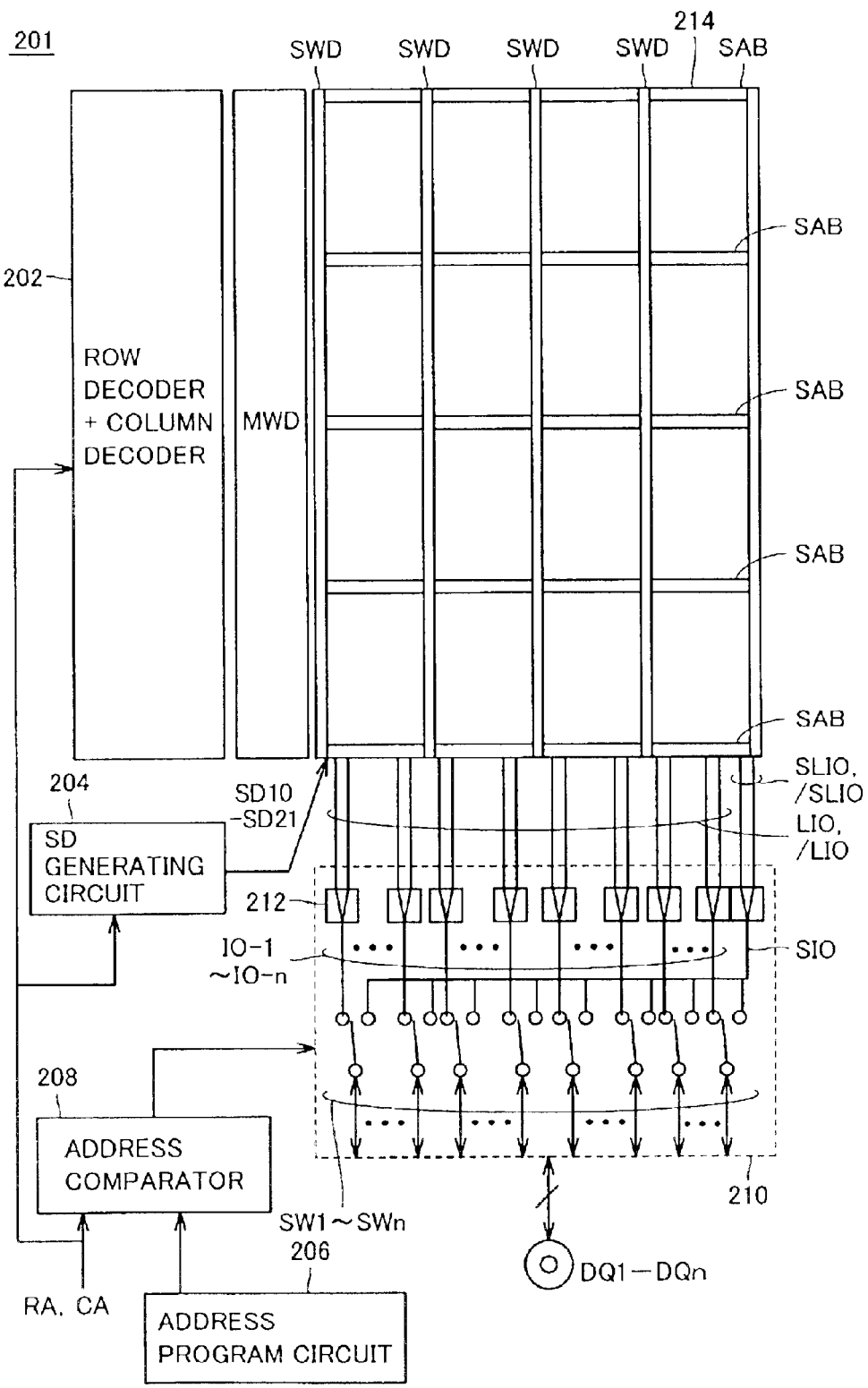
FIG. 8 is a block diagram showing a configuration of a semiconductor memory device 201 of a second embodiment.

FIG. 8 is a block diagram showing a configuration of a semiconductor memory device 201 of the second embodiment.

Referring to FIG. 8, semiconductor memory device 201 includes: an address program circuit 206 storing an address of a defective memory cell for which replacement with a spare memory cell is performed; an address comparator 208 comparing row address signal RA and column address signal CA both inputted externally with outputs of address program circuit 206; an SD generating circuit 204 generating signals SD10 to SD21 from row address signal RA and column address CA; and a row decoder+column decoder 202 receiving row address signal RA and column address signal CA to decode the signals.

Since SD generating circuit 204 is of a configuration similar to SD generating circuit 4 described in FIG. 3, no description thereof will be repeated.

Semiconductor memory device 201 further includes: a main word driver MWD driving a main word line according to an output of row decoder+column decoder 202; and a memory cell array 214 in which a select operation is performed according to signals SD10 to SD21 and an output of row decoder+column decoder 202.

Memory cell array 214 includes a plurality of sense amplifier bands SAB and a plurality of sub-word driver bands SWD and is divided into a plurality of memory blocks by a plurality of sense amplifier bands SAB and a plurality of sub-word driver bands SWD.

Semiconductor memory device 201 further includes: local IO lines LIO and /LIO for performing transmission/reception of data to/from normal memory cell groups included in memory cell array 214; and spare local IO lines SLIO and /SLIO for performing transmission/reception of data to/from a spare memory cell included in memory cell array 214.

Semiconductor memory device 201 further includes: an IO replacement circuit 210 performing transmission/reception of data between local IO lines LIO and /LIO and spare local IO line SLIO and /SLIO, and external terminals.

IO replacement circuit 210 includes: read amplifiers 212, each except one detecting a potential difference between local IO lines LIO and /LIO to output the potential difference to corresponding one of IO lines IO-1 to IO-n and the one amplifying a potential difference between spare local IO lines SLIO and /SLIO to output the amplified difference to spare IO lines SIO; and switches SW1 to SWn replacing one of IO lines IO-1 to IO-n with a spare IO line SIO according to an output of address comparator 208.

Semiconductor memory device 201 performs selection of memory cell row and column as a first stage with row decoder+column decoder 202, sub-word driver SWD and SD generating circuit 204. Furthermore, semiconductor memory device 201 performs selection of IO line as a second stage with address program circuit 206, address comparator 208 and IO replacement circuit 210. Replacement of a normal memory cell with a spare memory cell is performed on IO line selection at the second stage.

Figure 9:
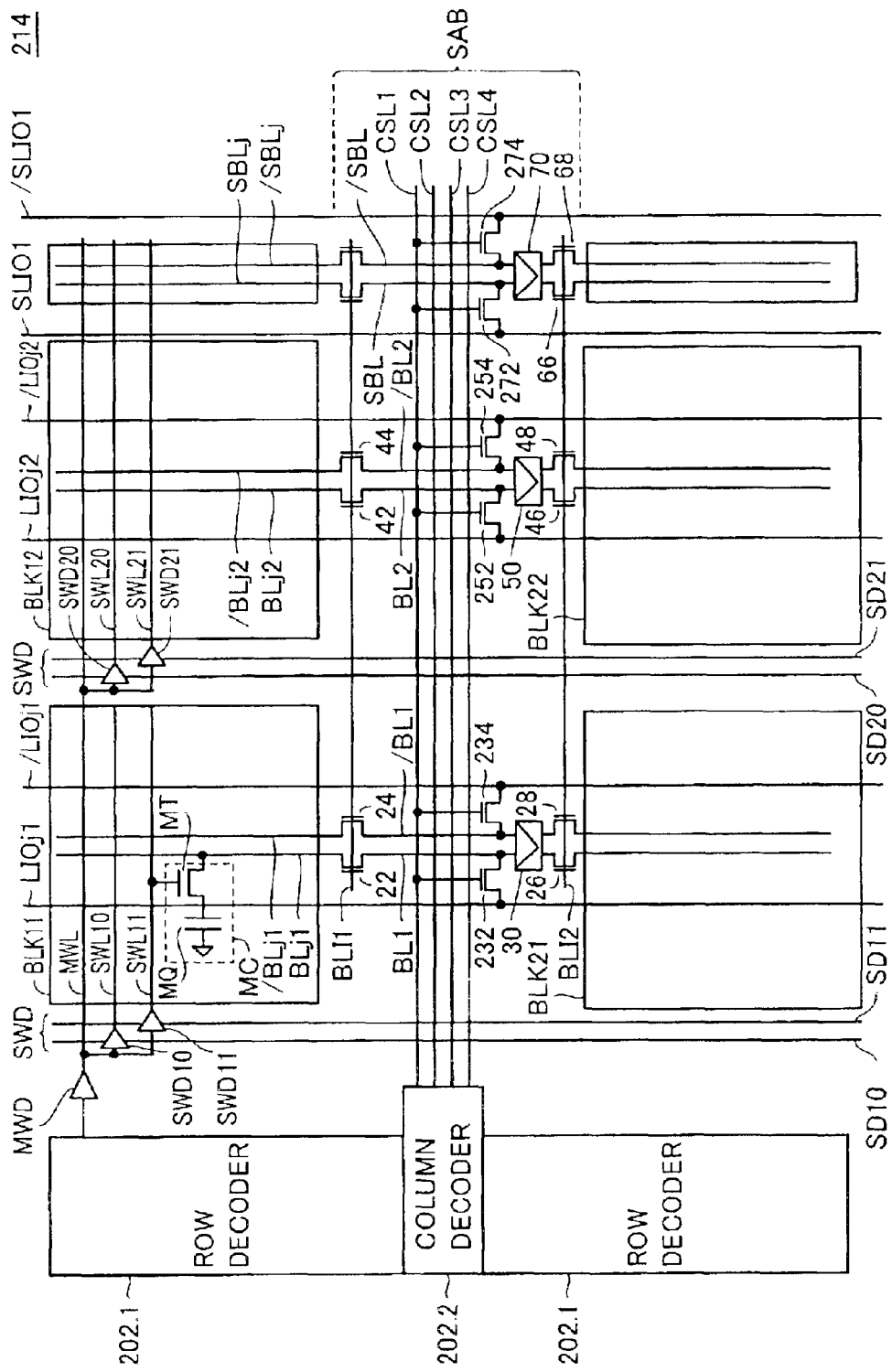
FIG. 9 is a diagram for describing configurations of a row decoder+column decoder 202 and a memory cell array 214 in FIG. 8.

FIG. 9 is a diagram for describing configurations of row decoder+column decoder 202 and memory cell array 214 in FIG. 8.

Referring to FIG. 9, row decoder+column decoder 202 includes: a column decoder 202.2 provided to each sense amplifier band; and a row decoder 202.1 provided to each region partitioned by sense amplifier bands.

Memory cell array 214 is of a configuration obtained by providing column select lines CSL1 to CSL4 instead of data lines DB1, /DB1, DB2 and /DB2 in sense amplifier band SAB of the configuration of memory cell array 14 described in FIG. 2. Column select lines CSL1 to CSL4 are selected by column decoder 202.2 provided to each sense amplifier band SAB.

While, in FIG. 2, column select lines are provided in parallel to bit lines, in memory cell array 214, local IO lines LIOj1, /LIOj1, LIOj2 and /LIOj2 are provided in parallel to bit lines and spare local IO lines SLIO1 and /SLIO1 are provided in parallel to spare bit lines SBLj and /SBLj.

In correspondence to the differences, provided in sense amplifier SAB are N-channel MOS transistors 232, 234, 252, 254, 272 and 274 instead of N-channel MOS transistors 32, 34, 52, 54, 76, 78, 72 and 74.

N-channel MOS transistor 232 is connected between bit line BL1 and local IO line LIOj1 and column select line CSL1 is connected to the gate thereof. N-channel MOS transistor 234 is connected between bit line /BL1 and local IO line /LIOj1 and column select line CSL1 is connected to the gate thereof.

N-channel MOS transistor 252 is connected between bit line BL2 and local IO line LIOj2 and column select line CSL1 is connected to the gate thereof. N-channel MOS transistor 254 is connected between bit line /BL2 and local IO line /LIOj2 and column select line CSL1 is connected to the gate thereof.

N-channel MOS transistor 272 is connected between bit line SBL and local IO line SLIO1 and column select line CSL1 is connected to the gate thereof. N-channel MOS transistor 274 is connected between bit line /SBL and local IO line /SLIO1 and column select line CSL1 is connected to the gate thereof.

Note that since the other parts of the configuration of memory cell array 214 are similar to corresponding parts of the configuration of memory cell array 14 shown in FIG. 2, none of descriptions thereof will be repeated.

Description will be given of a case where a saving rate is improved more compared with a conventional practice in the second embodiment.

Figure 10:
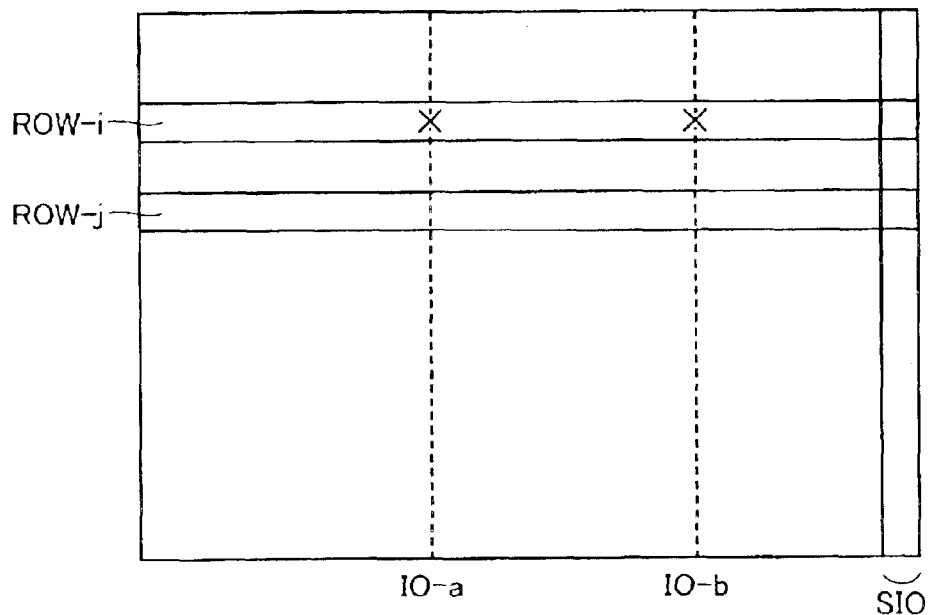
FIG. 10 is a logical address map for describing defect locations.

FIG. 10 is a logical address map for describing defect locations.

Referring to FIG. 10, defective memory cells are present at two locations on a row corresponding to row address ROW-i. One location is on IO line IO-a and the second location is on IO line IO-b. In such a case, if only one spare IO line SIO is available in a conventional IO replacement configuration, saving of a defective chip by IO replacement was impossible.

In the second embodiment, however, as shown in FIG. 9, the right half and the left half of a memory cell array are driven by different sub-word lines and a collectively driven unit of sub-word lines can be altered by SD generating circuit 204 of FIG. 8. Note that since the configuration of SD generating circuit 204 is of a configuration similar to SD generating circuit 4 described in FIGS. 3 and 4, no description thereof will be repeated.

Figure 11:
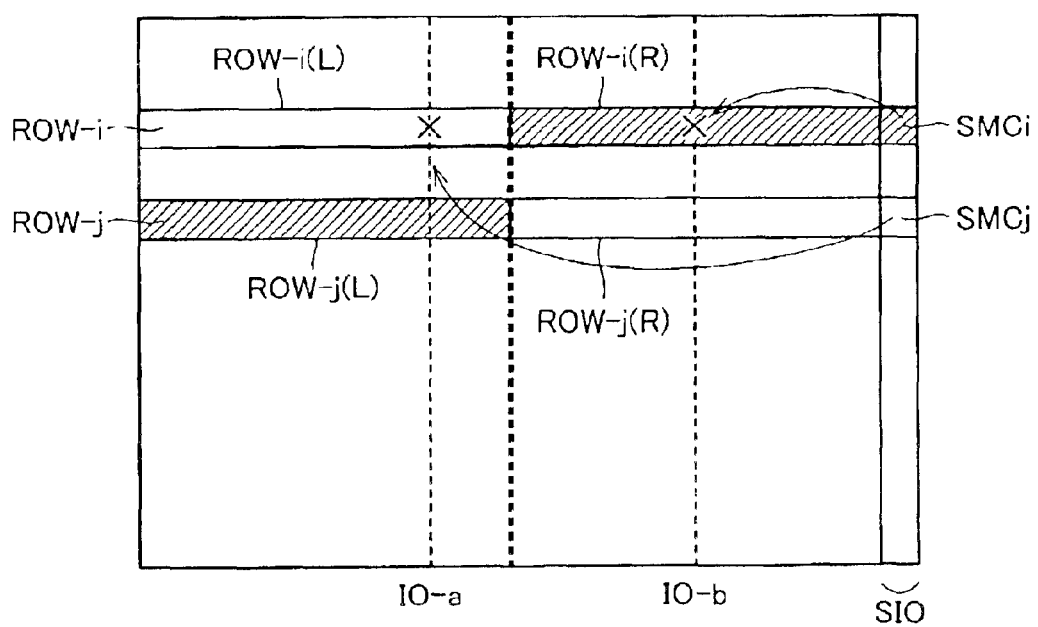
FIG. 11 is a diagram for describing replacement of a memory cell in the second embodiment.

FIG. 11 is a diagram for describing replacement of a memory cell in the second embodiment.

Referring to FIG. 11, if alteration in address assignment to the right and left halves of a memory cell therebetween is performed as to arrangement of memory cells selected simultaneously by row address ROW-i, defects as shown in FIG. 10 can be saved. That is, by alteration of settings in switch circuits 92, 96, 100 and 104 of SD generating circuit shown in FIG. 3, assignment of an address can be altered.

To be concrete, in a case of a normal mode, memory regions ROW-i (L) and ROW-i (R) and spare memory cell SMCi are collectively activated according to row address ROW-i. Furthermore, memory regions ROW-j (L) and ROW-j (R) and spare memory cell SMCj are collectively activated according to row address ROW-j, which is different from row address ROW-i.

In contrast to this, in a case where totally two defective memory cells are present one in each of right and left halves of the same and one row of a memory cell array, defects in such a situation can be saved by altering address assignment.

To be concrete, internal setting of the SD generating circuit 204 of FIG. 8 is altered in such a manner that memory regions ROW-i (L) and ROW-j (R) and spare memory cell SMCj are collectively activated in correspondence to row address ROW-i. In this case, it is only required that a replacement address is set in address program circuit 206 of FIG. 8 so that a defective memory cell present at a location corresponding to IO line IO-a in memory region ROW-i (L) is replaced with spare memory cell SMCj.

Furthermore, internal setting of the SD generating circuit 204 of FIG. 8 is altered in such a manner that memory regions ROW-j (L) and ROW-i (R) and spare memory cell SMCi are collectively activated in correspondence to row address ROW-j, which is different from row address ROW-i. In this case, it is only required that a replacement address is set in address program circuit 206 of FIG. 8 so that a defective memory cell present at a location corresponding to IO line IO-b in memory region ROW-i (R) is replaced with spare memory cell SMCi.

Such address replacement can be realized by alteration in setting in switch circuits 92, 96, 100 and 104 of the SD generating circuit shown in FIG. 3. For example, the address replacement can be realized by that switch circuit 100 is altered in its setting so as to output row address /RA0 and switch circuit 104 is altered in its setting so as to output row address RA0.

As described above, in the second embodiment as well, saving can be realized of a defective chip in which defective memory cells are present at a plurality of locations on one memory cell row, which, in a conventional practice, was not able to be saved by replacement.

That is, by altering address assignment to normal memory cells to alter an activation unit of defective memory cells generated at normal memory cells, defects can be distributed, thereby enabling replacement with spare memory cell. With the replacement thus enabled, a product yield can be improved.

Third Embodiment

While the third embodiment relates to a configuration in which spare IO line is substituted similarly to the second embodiment, description will be given of a case where a circuit configuration of a route from a memory cell array to data input/output terminals is different from the second embodiment.

Figure 12:
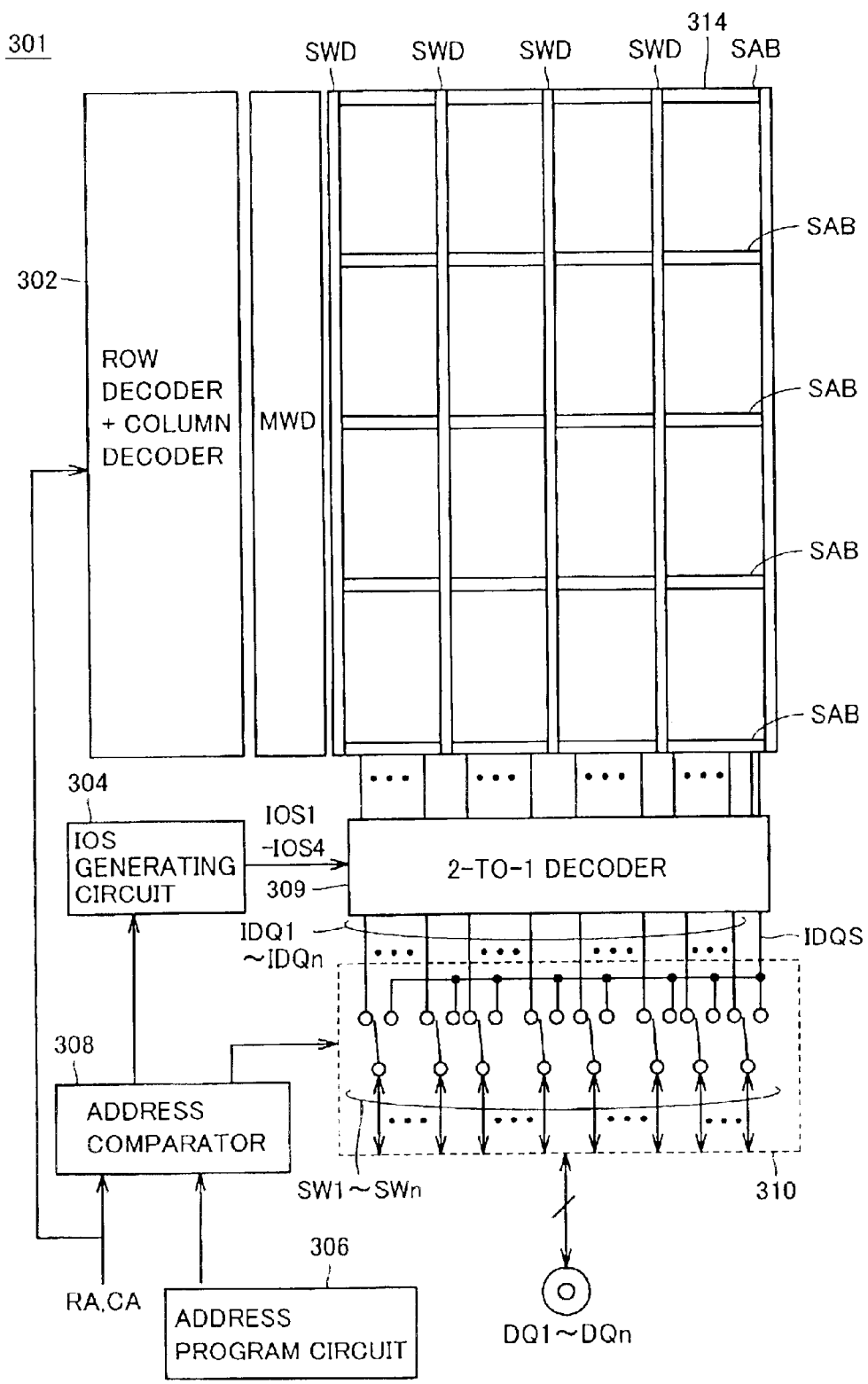
FIG. 12 is a block diagram showing a configuration of a semiconductor memory device 301 of a third embodiment.

FIG. 12 is a block diagram showing a configuration of a semiconductor memory device 301 of a third embodiment.

Referring to FIG. 12, semiconductor memory device 301 includes: an address program circuit 306 storing an address of a defective memory cell for which replacement with a spare memory cell is performed; an address comparator 308 comparing row address signal RA and column address signal CA both inputted externally with outputs of address program circuit 306; an IOS generating circuit 304 receiving an output of address comparator 308 to generate signals IOS1 to IOS4; and row decoder+column decoder 302 receiving row address signal RA and column address signal CA to decode the signals.

Semiconductor memory device 301 further includes: a main word driver MWD driving a main word line according to an output of row decoder+column decoder 302; and a memory cell array 314 in which a select operation is performed according to an output of row decoder+column decoder 302.

Memory cell array 314 includes: a plurality of sense amplifier bands SAB and a plurality of sub-word line bands SWD and is divided into a plurality of memory clocks by a plurality of sense amplifier bands SAB and a plurality of sub-word line bands SWD.

Semiconductor memory device 301 further includes: a 2-to-1 decoder selecting a half of local IO lines LIO and /LIO and spare local IO lines SLIO and /SLIO onto which data from the memory cell array is outputted to connect the selected half to data lines IDQ1 to IDQn and IDQs; and a data line replacement circuit 310 selecting data line IDQs instead of one of data lines IDQ1 to IDQn to connect the data line IDQs to a terminal.

Data line replacement circuit 310 includes: switches SW1 to SWn for replacing data lines IDQ1 to IDQn with spare data line IDQs.

Since configurations of memory cell array 314 and row decoder+column decoder 302 are similar to the configurations of memory cell array 214 and row decoder+column decoder 202 described in FIG. 9, neither of descriptions thereof will be repeated.

Semiconductor memory device 301 performs selection of a row and a column of memory cells and local IO line at a first stage with row decoder+column decoder 302, sub-word driver SWD, IOS generating circuit 304 and 2-to-1 decoder 309. Furthermore. semiconductor memory device 301 performs selection of a data line as a second stage with address program circuit 306, address comparator 308 and data line replacement circuit 310. Replacement of a normal memory cell with a spare memory cell is performed on selection of a data line at the second stage.

Figure 13:
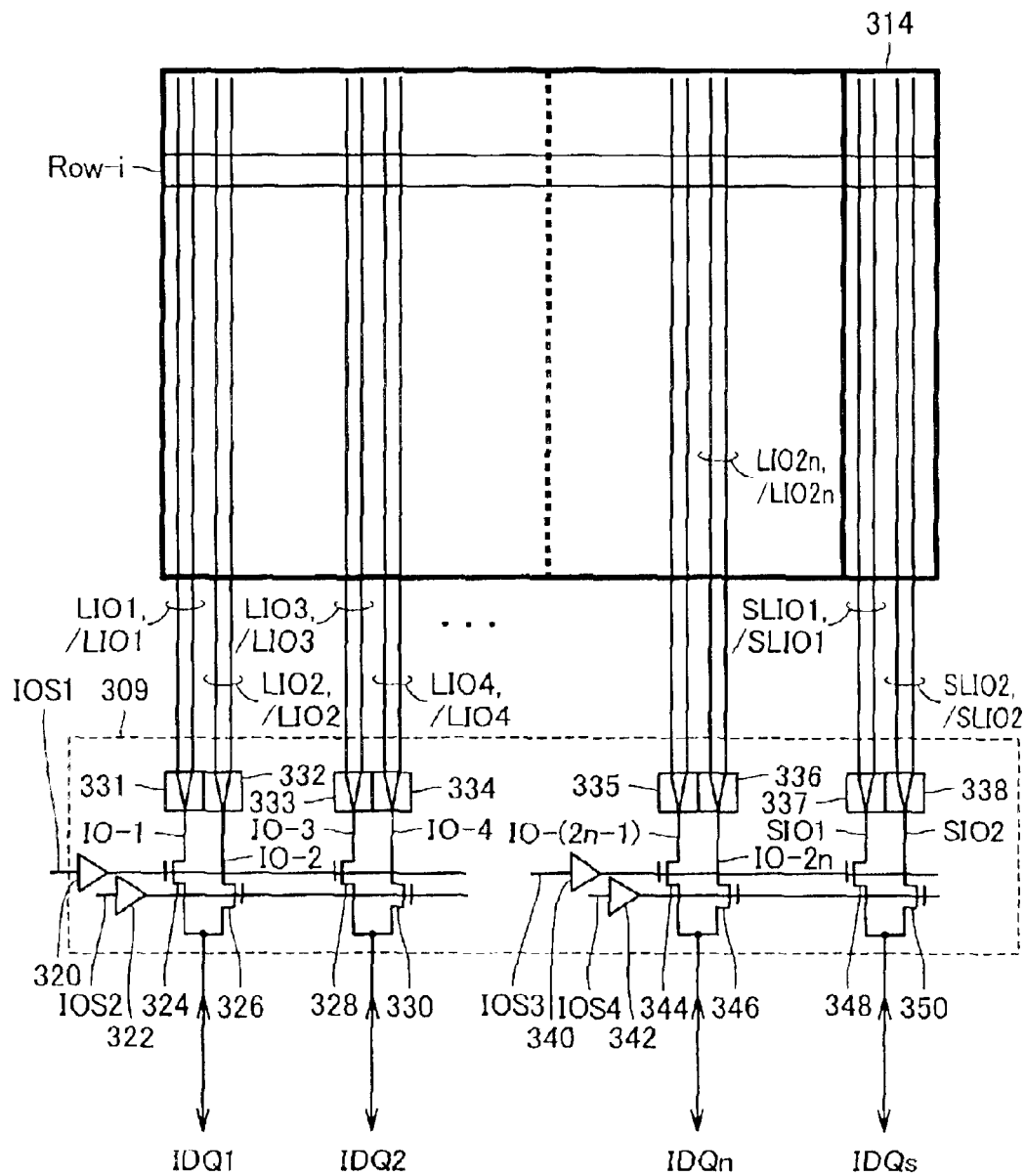
FIG. 13 is a circuit diagram showing a configuration of a 2-to-1 decoder 309 in FIG. 12.

FIG. 13 is a circuit diagram showing a configuration of 2-to-1 decoder 309 in FIG. 12.

Referring to FIG. 13, 2-to-1 decoder 309 includes: a read amplifier 331 amplifying a potential difference between local IO lines LIO1 and /LIO1 supplying/receiving to/from memory cell array 314 to output the amplified potential difference onto IO line IO-1; a read amplifier 332 amplifying a potential difference between local IO lines LIO2 and /LIO2 to output the amplified potential difference onto IO line IO-2; a read amplifier 333 amplifying a potential difference between local IO lines LIO3 and /LIO3 to output the amplified potential difference onto IO line IO-3; and a read amplifier 334 amplifying a potential difference between local IO lines LIO4 and /LIO4 to output the amplified potential difference onto IO line IO-4.

2-to-1 decoder 309 includes: a read amplifier 335 amplifying a potential difference generated between local IO lines LIO2n–1 and /LIO2n–1 to output the amplified potential difference onto IO line IO-(2n–1); and a read amplifier 336 amplifying a potential difference generated between local IO lines LIO2n and /LIO2n to output the amplified potential difference onto IO line IO-2n; a read amplifier 337 amplifying a potential difference generated between spare local IO lines SLIO1 and /SLIO1 to output the amplified potential difference onto IO line SIO1; and a read amplifier 338 amplifying a potential difference generated between spare local IO lines SLIO2 and /SLIO2 to output the amplified potential difference onto IO line SIO2.

2-to-1 decoder 309 further includes: buffer circuits 320, 322, 340 and 342 receiving respective signal IOS1, IOS2, IOS3 and IOS4.

2-to-1 decoder 309 further includes: an N-channel MOS transistor 342 connected between IO line IO-1 and data line IDQ1, and receiving an output of buffer circuit 320 at the gate thereof; an N-channel MOS transistor 326 connected between IO line IO-2 and data line IDQ1, and receiving an output of buffer circuit 322 at the gate thereof; an N-channel MOS transistor 328 connected between IO line IO-3 and data line IDQ2, and receiving an output of buffer circuit 320 at the gate thereof; and an N-channel MOS transistor 330 connected between IO line IO-4 and data line IDQ2, and receiving an output of buffer circuit 322 at the gate thereof.

2-to-1 decoder 309 further includes: an N-channel MOS transistor 344 connected between IO line IO-(2n−1) and data line IDQn, and receiving an output of buffer circuit 340 at the gate thereof; an N-channel MOS transistor 346 connected between IO line IO-2n and data line IDQn, and receiving an output of buffer circuit 342 at the gate thereof; an N-channel MOS transistor 348 connected between spare IO line SIO1 and data line IDQs, and receiving an output of buffer circuit 340 at the gate thereof; and an N-channel MOS transistor 350 connected between spare IO line SIO2 and data line IDQs, and receiving an output of buffer circuit 342 at the gate thereof.

Figure 14:
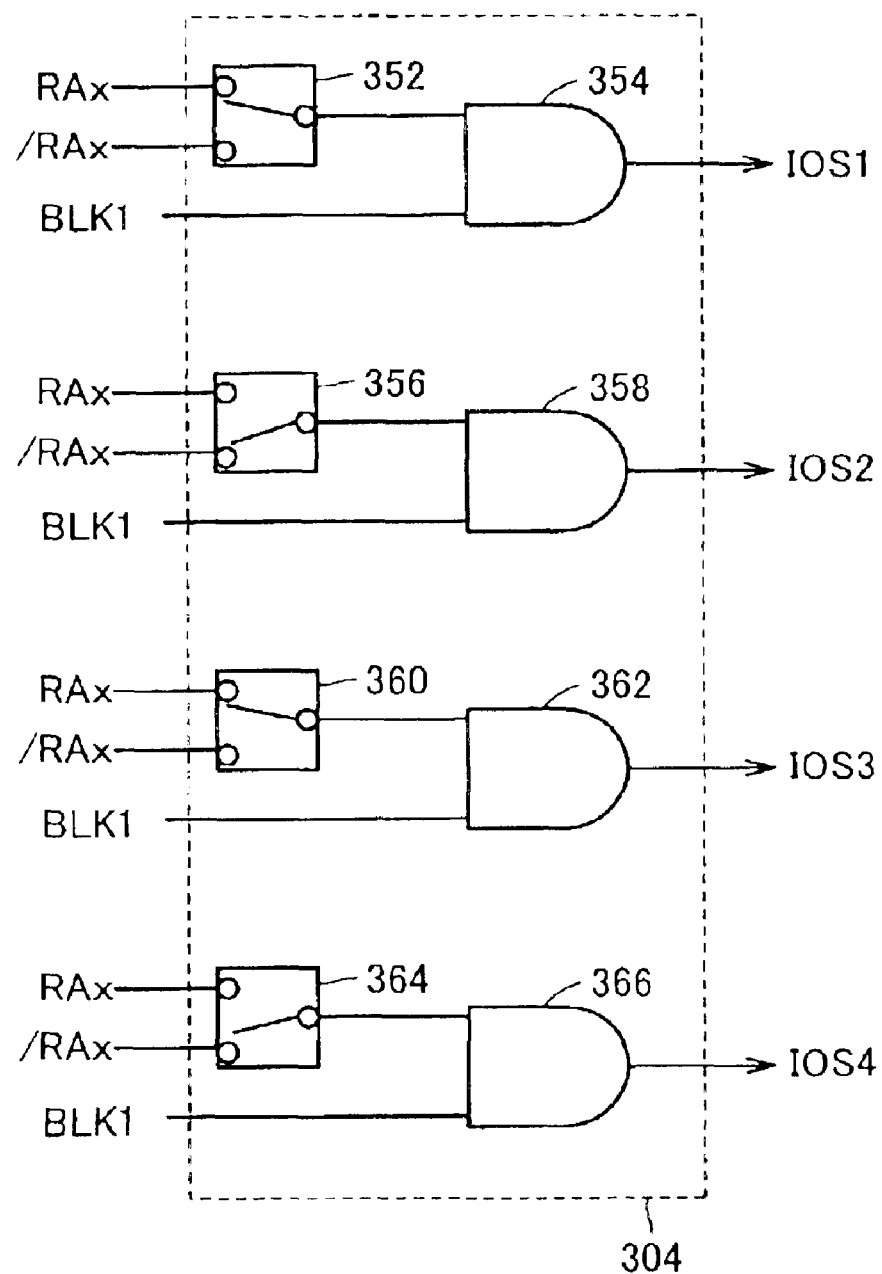
FIG. 14 is a circuit diagram showing a configuration of an IOS generating circuit 304 in FIG. 12.

FIG. 14 is a circuit diagram showing a configuration of IOS generating circuit 304 in FIG. 12.

Referring to FIG. 14, IOS generating circuit 304 includes: a switch circuit 352 selecting one of row address signal RAx and a signal /RAx which is an inverted signal thereof; an AND circuit 354 receiving an output of switch circuit 352 and block select signal BLK1 to output signal IOS1; a switch circuit 356; and an AND circuit 358 receiving outputs of switch circuit 356 and block select signal BLK1 to output signal IOS2.

IOS generating circuit 304 further includes; a switch circuit 360; an AND circuit 362 receiving an output of switch circuit 360 and block select signal BLK1 to output signal IOS3; a switch circuit 364; and an AND circuit 366 receiving an output of switch circuit 364 and block select signal BLK1 to output signal IOS4.

Note that block select signal BLK1 is a signal activating a division unit partitioned by sense amplifier bands SAB in memory cell array 314 shown in FIG. 12. Block select signal BLK1 is supplied from row decoder+column decoder 302, where a row address signal is decoded to block select signal BLK1. Though not shown, IOS generating circuit 304 includes similar circuits the number of which is equal to the number of division units obtained by partitioning by sense amplifier bands SAB. A corresponding block select signal is inputted to IOS generating circuit 304.

Furthermore, since configurations of switch circuits 352, 356, 360 and 364 are similar to switch circuit 92 described in FIG. 4, none of descriptions thereof will be repeated. Note that as described in FIG. 7, the configurations switches 352, 356, 360 and 364 are of a configuration similar to the switch circuit 92A and an address replacement may be performed only when a corresponding address is inputted.

IOS generating circuit 304 performs one of a first and second operations described below:

In the first operation, IOS generating circuit 304 selects collectively IO lines IO-1 and IO-3 and IO line IO-(2n−1) and spare IO line SIO1 of FIG. 13 according to input address bit RAx while, in a case where input address bit RAx is inverted, selecting collectively IO lines IO-2 and IO-4, IO line IO-2n and spare IO line SIO2 of FIG. 13.

In the second operation, IOS generating circuit 304 selects collectively IO lines IO-1 and IO-3 and IO line IO-2n and spare IO line SIO2 of FIG. 13 according to input address bit RAx while, in a case where input address bit RAx is inverted, selecting collectively IO lines IO-2 and IO-4, IO line IO-(2n−1) and spare IO line SIO1 of FIG. 13.

Which of the first and second operations is performed is determined by setting of fuses included in switch circuits 352, 356, 360 and 364. 2-to-1 decoder 309 of FIG. 13 performs a select operation of a data line according to signals IOS1 to IOS4 outputted by IOS generating circuit 304.

Figure 15:
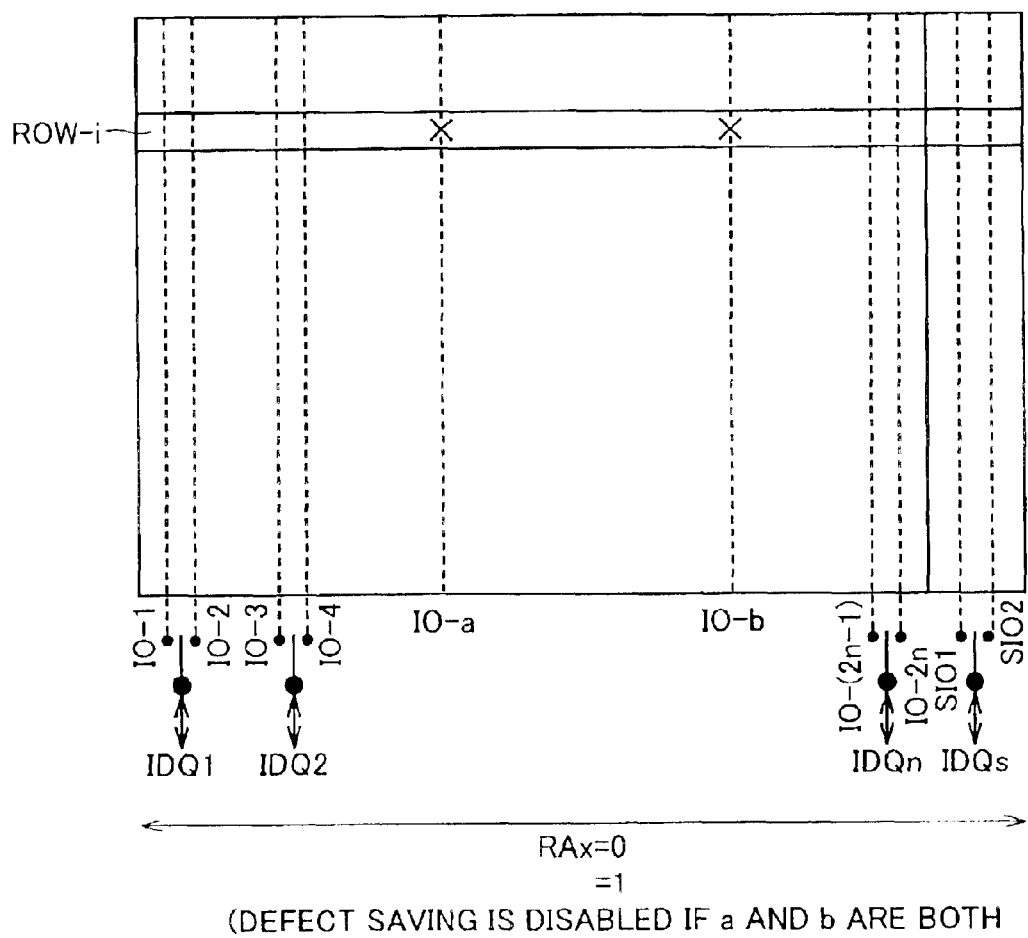
FIG. 15 is a diagram for describing a case where a plurality of defective memory cells are present on one memory cell row of a memory cell array.

FIG. 15 is a diagram for describing a case where a plurality of defective memory cells are present on one memory cell row of a memory cell array.

In FIG. 15, there is shown a case where defective memory cells are present at two locations on a memory cell row corresponding to row address ROW-i. One of an even-numbered IO line and an odd-numbered IO line is connected to a data line by 2-to-1 decoder described in FIG. 13 to read out data to outside. In such a configuration, in a case where IO lines IO-a and IO-b on which defective memory cells were present are both even-numbered or odd-numbered, saving was impossible in a conventional practice even if two spare IO lines SIO1 and SIO2 were available.

As described in FIG. 13, however, if 2-to-1 decoder 309 is of a configuration functioning so that a memory cell array is divided into the right and left halves to enable change in selection therebetween as described in FIG. 13, saving of such a defective chip is enabled. When saving is performed, in the right half of the memory cell array, a defective memory cell is replaced with a spare memory cell as in a regular way. On the other hand, in the left half thereof, spare substitution can be performed by switching between connections in switch circuits 352 and 356 shown in FIG. 14.

Figure 16:
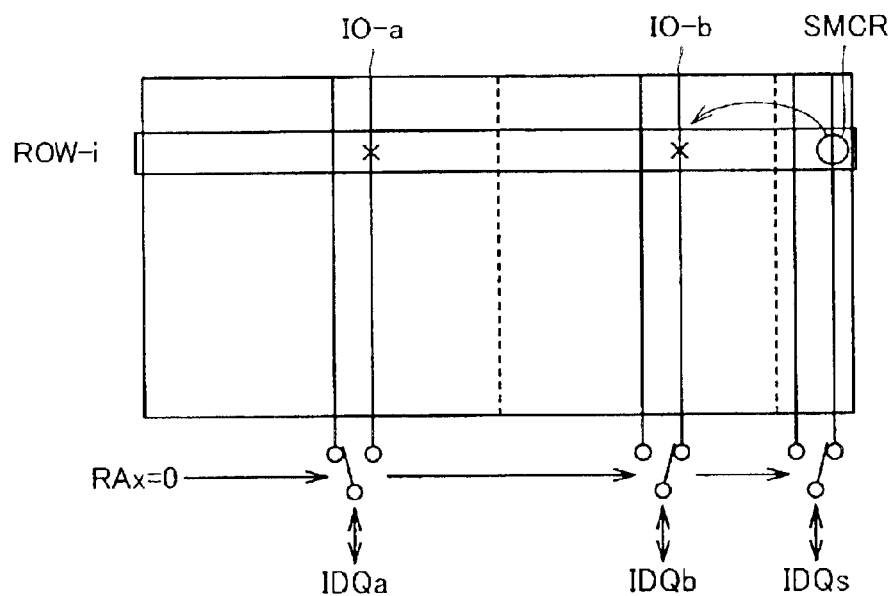
FIG. 16 is a diagram for describing replacement of a defective memory cell when a signal bit RAx of a row address signal is 0.

FIG. 16 is a diagram for describing replacement of a defective memory cell when a signal bit RAx of a row address signal is 0.

Referring to FIG. 16, description will be given of a case where IO lines IO-a and IO-b are both even-numbered. In the left half of the array including IO line IO-a, switches are set so as to select an odd-numbered IO line when row address signal bit RAx is 0.

On the other hand, in the right half of the array including IO line IO-b and spare IO line, switches are set so as to select an even-numbered IO line when row address signal bit RAx is 0. By doing so, there is no chance that two defective memory cells are simultaneously designated.

When address bit RAx is 0, spare memory cell SMCR can be therefore used as a substitute for a defective memory cell on IO line IO-b.

Figure 17:
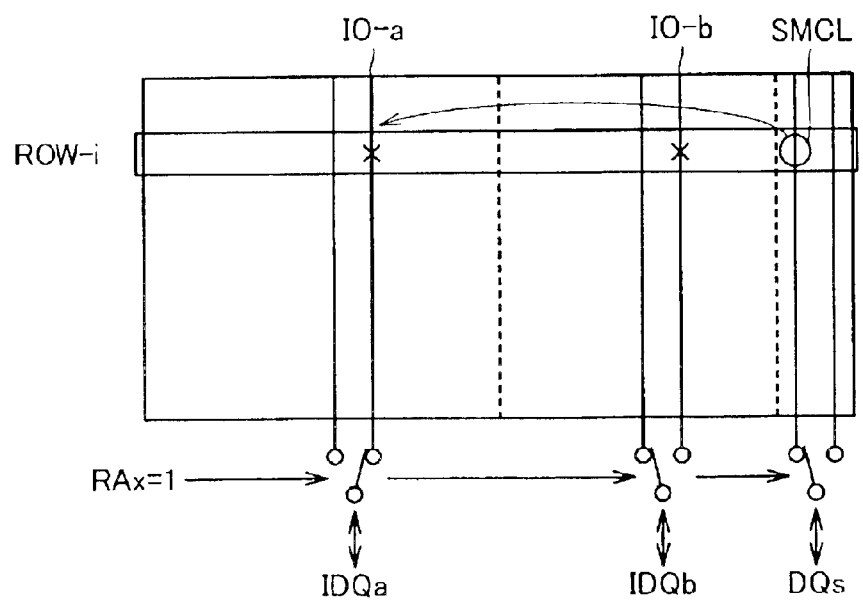
FIG. 17 is a diagram for describing replacement of a defective memory cell when a signal bit RAx of a row address signal is 1.

FIG. 17 is a diagram for describing replacement of a defective memory cell when a signal bit RAx of a row address signal is 1.

Referring to FIG. 17, when signal bit RAx of row address signal is 1, switches are selected so as to select an even-numbered IO line for the right half of the array. On the other hand, for the left half of the array, switches are selected so as to select an odd-numbered IO line when signal bit RAx of row address signal is 1. With such setting, a defective memory cell on IO line IO-a is replaced with spare memory cell SMCL to save a chip.

By performing replacement as described in FIGS. 16 and 17, a defective chip that was not able to be saved in a conventional practice can be save as a good chip. Accordingly, more of improvement on a product yield can be expected for a semiconductor memory device of the third embodiment compared to a conventional case.

Fourth Embodiment

In the first to third embodiments, description is given of a case where the right and left halves of a memory cell array are address assigned so as be different from each other, thereby improving a saving rate with a spare memory cell.

However, alteration in address assignment is not limited to a case where one memory cell array is divided into division units, but there is also a case where memory cells located remotely apart from each other are collectively activated according to one row address input. In such a latter case, the present invention can be applied as well.

Figure 18:
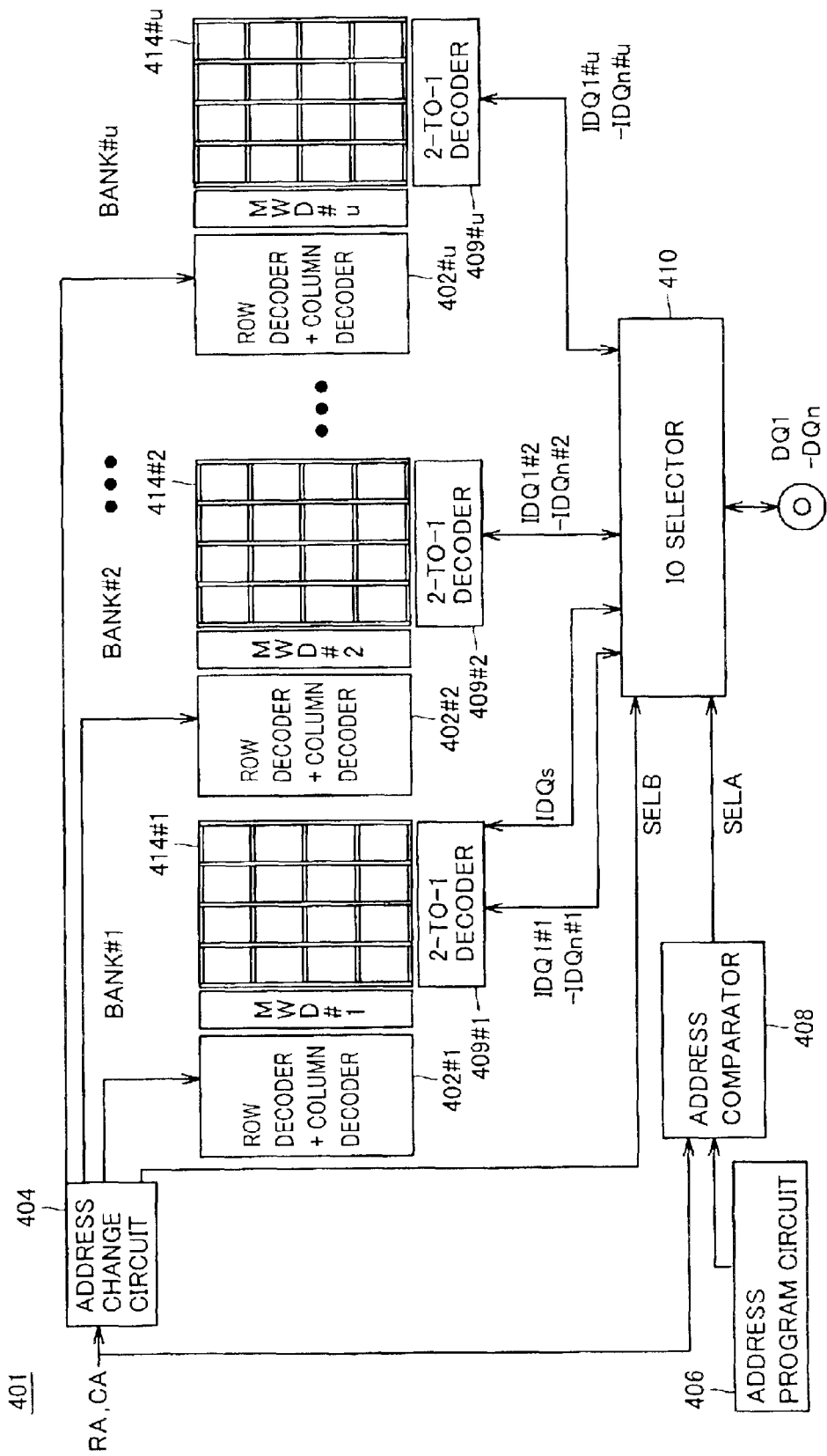
FIG. 18 is a schematic block diagram showing a configuration of a semiconductor memory device 401 of a fourth embodiment.

FIG. 18 is a schematic block diagram showing a configuration of a semiconductor memory device 401 of a fourth embodiment.

Referring to FIG. 18, semiconductor memory device 401 includes: a plurality of memory banks BANK#1 to BANK#u; an address change circuit 404 performing a change between correspondence to banks of addresses of row address signals RA and column address signals CA; an address program circuit 406 storing an address of a defective memory cell; a address comparator 408 comparing row address RA and column address CA with outputs of address program circuit 406 to output control signal SELA; and an IO selector 410 selecting outputs of banks BANK#1 to BANK#u according to control signal SELB outputted from address change circuit 404 and control signal SELA outputted from address comparator 408 to output the selected output to a data terminal.

Memory bank BANK#1 includes: a row decoder+column decoder 402#1 receiving a row address and a column address after an address change process by address change circuit 404; a main word driver MWD#1; a memory cell array 414#1; and 2-to-1 decoder 409#1 performing transmission/reception of data between memory cell array 414#1 and each of data lines IDQ1#1 to IDQn#1 and IDQs.

Memory bank BANK#2 includes: a row decoder+column decoder 402#2 receiving a row address and a column address after an address change process by address change circuit 404; a main word driver MWD#2; a memory cell array 414#2; and 2-to-1 decoder 409#2 performing transmission/reception of data of data between memory cell array 414#2 and each of data lines IDQ1#2 to IDQn#2.

Memory bank BANK#u includes: a row decoder+column decoder 402#u receiving a row address and a column address after an address change process by address change circuit 404; a main word driver MWD#u; a memory cell array 414#u; and 2-to-1 decoder 409#u performing transmission/reception of data between memory cell array 414#u and each of data lines IDQ1#u to IDQn#u.

Herein, memory bank BANK#1 is provided with spare IO line and spare memory cell as described in FIG. 9. On the other hand, memory banks BANK#2 to BANK#u are each provided with no spare memory cell. In such a case as well, as to semiconductor memory device 401, in a case where a defective memory cell is present in one of memory banks BANK#2 to BANK#u, the defective memory cell can be replaced with a spare memory cell included in memory bank BANK#1.

Figure 19:
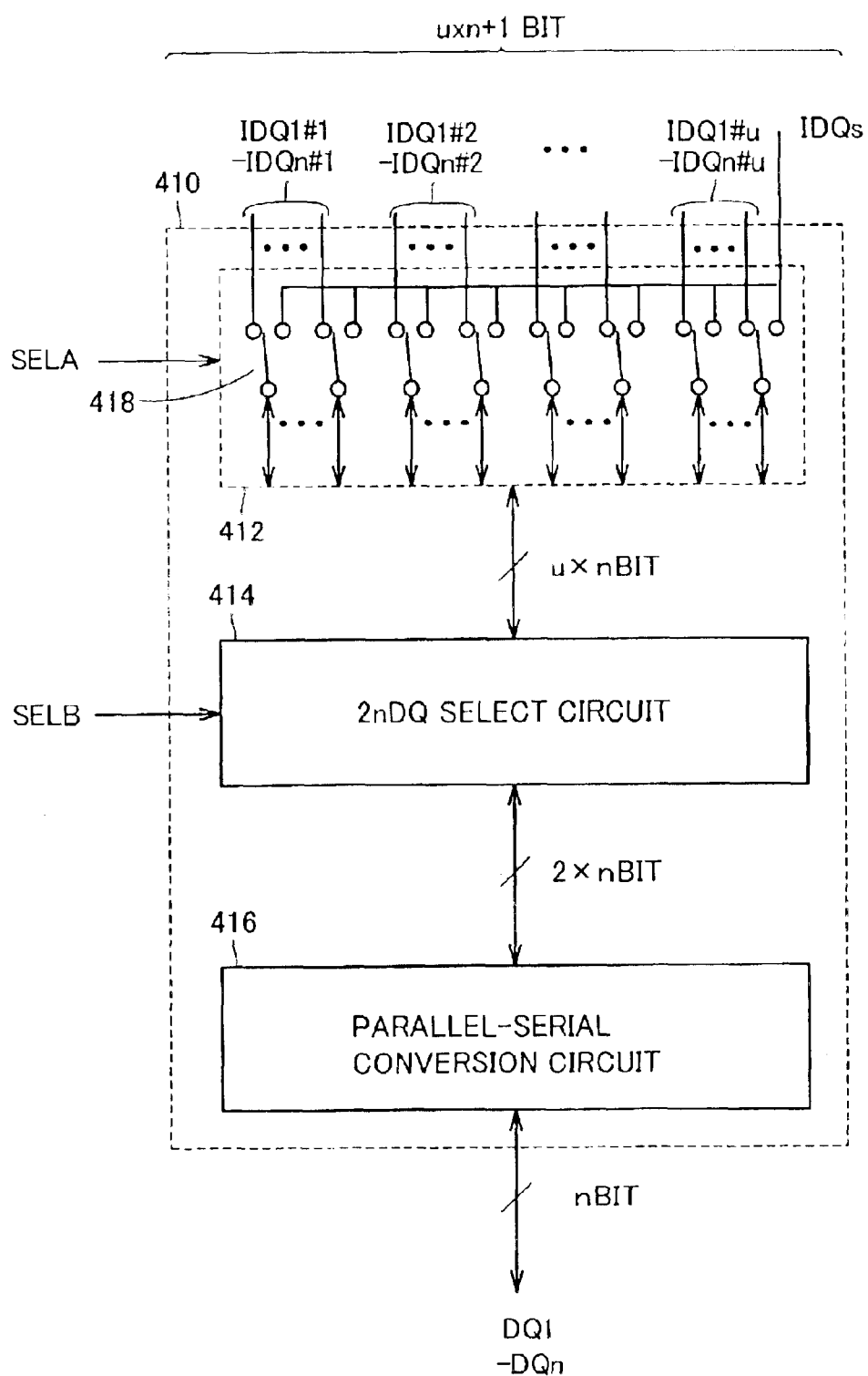
FIG. 19 is a circuit diagram showing a configuration of an IO selector 410 in FIG. 18.

FIG. 19 is a circuit diagram showing a configuration of IO selector 410 in FIG. 18.

Referring to FIG. 19, IO selector 410 includes: an IO replacement circuit 412; a 2nDQ select circuit 414; and a parallel-serial conversion circuit 416.

IO replacement circuit 412 includes a plurality of switches 418. If a defective address and an input address coincide with each other, replacement of a memory cell is performed according to signal SELA outputted from address comparator 408. Switch 418 switches between spare data line IDQs and one of the other data lines IDQ1#1 to IDQn#1, IDQ1#2 to IDQn#2, ..., IDQ1#u to IDQn#u according to signal SELA.

2nDQ select circuit 414 selects 2×n bits among data lines of u×n bits which are output of IO replacement circuit 412 according to control signal SELB outputted from address change circuit 404.

Parallel-serial conversion circuit 416 performs parallel-serial conversion of data of 2×n bits into n bits to output signals DQ1 to DQn.

In FIG. 19, description is given of a case where two banks among a plurality of banks are simultaneously selected according to one address to perform 2 bit prefetch therefrom to output data at a frequency twice as large as a read frequency from the memory banks.

In such a case as well, address assignment is altered by address change circuit 404 of FIG. 18 so that a memory bank including a defective memory cell and a bank including a spare memory cell are simultaneously activated. Address change circuit 404 can be realized using a configuration similar to the configurations shown in FIGS. 3 and 14.

Note that in a case where more than two banks are simultaneously activated as well, without limiting to only a case where two banks are simultaneously activated, improvement is enabled on a saving rate with a spare memory cell through address change in a similar manner.

As described above, in the fourth embodiment as well, with alteration in address assignment applied to normal memory cells, a saving rate in substitution with a spare memory cell can be improved and in turn, a product yield can be enhanced.

Fifth Embodiment

Figure 20:
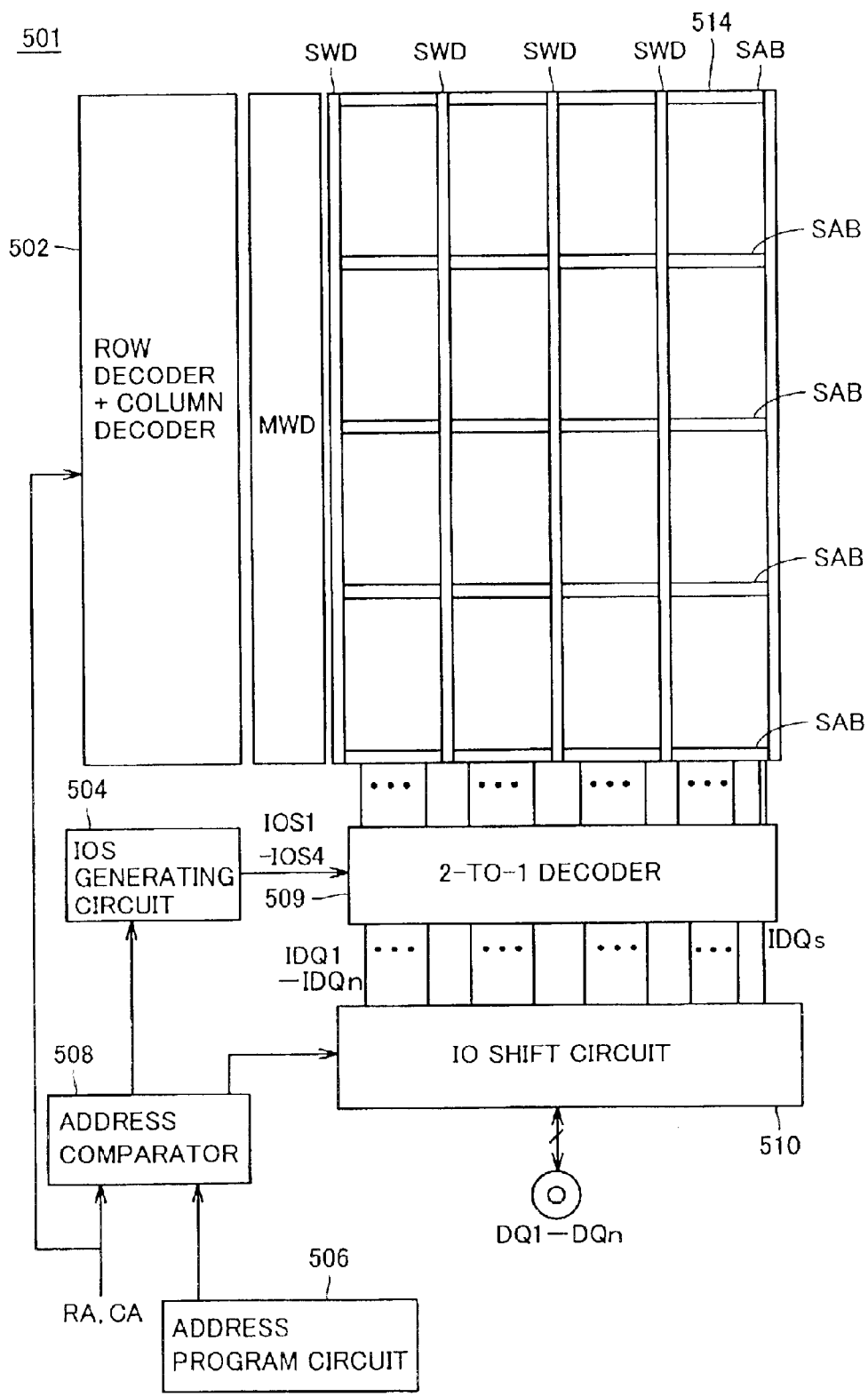
FIG. 20 is a block diagram showing a configuration of a semiconductor memory device 501 of a fifth embodiment.

FIG. 20 is a block diagram showing a configuration of a semiconductor memory device 501 of a fifth embodiment.

Referring to FIG. 20, semiconductor memory device 501 includes: an address program circuit 506 storing an address of a defective memory cell for which substitution with a spare memory cell is performed; an address comparator 508 comparing row address signal RA and column address CA inputted externally with outputs of address program circuit 506; an IOS generating circuit 504 receiving an output of address comparator 508 to generate signals IOS1 to IOS4; and a row decoder+column decoder 502 receiving row address signal RA and column address signal CA to decode the signals.

Semiconductor memory device 501 further includes: a main word driver MWD driving a main word line according to an output of row decoder+column decoder 502; and a memory cell array 514 in which a select operation is performed according to an output of row decoder+column decoder 502.

Memory cell array 514 includes a plurality of sense amplifier bands SAB and a plurality of sub-word driver bands SWD, and is divided into a plurality of memory blocks by a plurality of sense amplifier bands SAB and a plurality of sub-word driver bands SWD.

Semiconductor memory device 501 further includes a 2-to-1 decoder 509 selecting a half of local IO lines LIO and /LIO and spare local IO lines SLIO and /SLIO onto which data from the memory cell array is outputted to connect the half to data lines IDQ1 to IDQn and IDQs.

Since the configurations of memory cell array 514 and row decoder+column decoder 502 are similar to memory cell array 214 and row decoder+column decoder 202 described in FIG. 9, none of descriptions thereof will be repeated. Since the configuration of IOS generating circuit 504 is similar to IOS generating circuit 304 described in FIG. 14, no description thereof will be repeated. Furthermore, since 2-to-i decoder 509 as well is of a configuration similar to 2-to-1 decoder 309 described in FIG. 13, no description will be repeated.

Semiconductor memory device 501 further includes an IO shift circuit 510 shifting connection of data lines IDQ1 to IDQn and spare data line IDQs to terminals according to an output of address comparator 508. IO shift circuit 510 uses spare data line IDQs when an output of address comparator 508 indicates coincidence between a programmed address of a defective memory cell and an input address.

Figure 21:
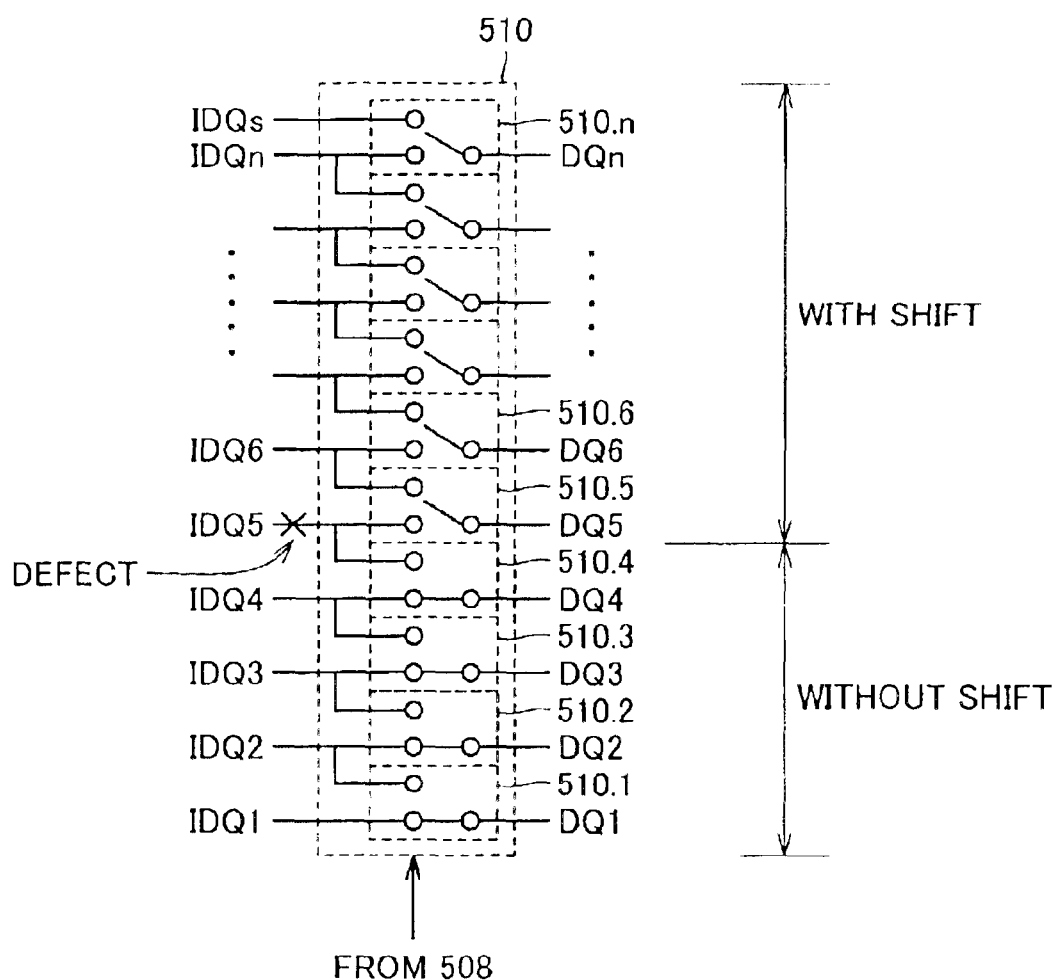
FIG. 21 is a circuit diagram showing a configuration of an IO shift circuit 510 in FIG. 20.

FIG. 21 is a circuit diagram showing a configuration of IO shift circuit 510 in FIG. 20.

Referring to FIG. 21, IO shift circuit 510 includes switch circuits 510.1 to 510.n provided correspondingly to respective data signals DQ1 to DQn. Connections in switch circuits 510.1 to 510.n are switched according to respective outputs of address comparator 508.

Switch circuit 510.1 connects one of data lines IDQ1 and IDQ2 to a terminal outputting data signal DQ1. Switch circuit 510.1, in a case of "without shift," connects data line IDQ1 to a terminal outputting data signal DQ1, while, in a case of "with shift," connecting data line IDQ2 to a terminal outputting data signal DQ1.

Likewise, each of the other switch circuits, in a case of "without shift," connects data line with a corresponding number to a terminal with the corresponding number, while, in a case of "with shift," connecting a data line with a number larger than a corresponding number by 1 to a terminal with the corresponding number. However, switch circuit 510.n, in a case of "with shift," connects spare data line IDQs to a terminal outputting data signal DQn.

Now, description will be here given of a case where a defect arises in data line IDQ5. In such a case, switch circuits 510.1 to 510.4 corresponding to terminals outputting data signals DQ1 to DQ4 are set into a state of "without shift", while switch circuits 510.5 to 510.n corresponding to data signals DQ5 to DQn are set into a state of "with shift." Then, data line IDQ5 has no connection with any terminal, which may be left in no use.

An advantage from such a shift scheme is that a high speed access is enabled. That is, if an access is made through a complex replacement circuit of a spare IO line as in IO replacement circuit 210 of FIG. 8, a route through which data is read from spare IO line is longer in a case of substitution for a remote IO line. Furthermore, a parasitic capacitance of spare IO line is larger than those of the other IO lines. Replacement by the shift scheme can overcome these weak points to thereby reduce a delay in data access due to the replacement.

Figure 22:
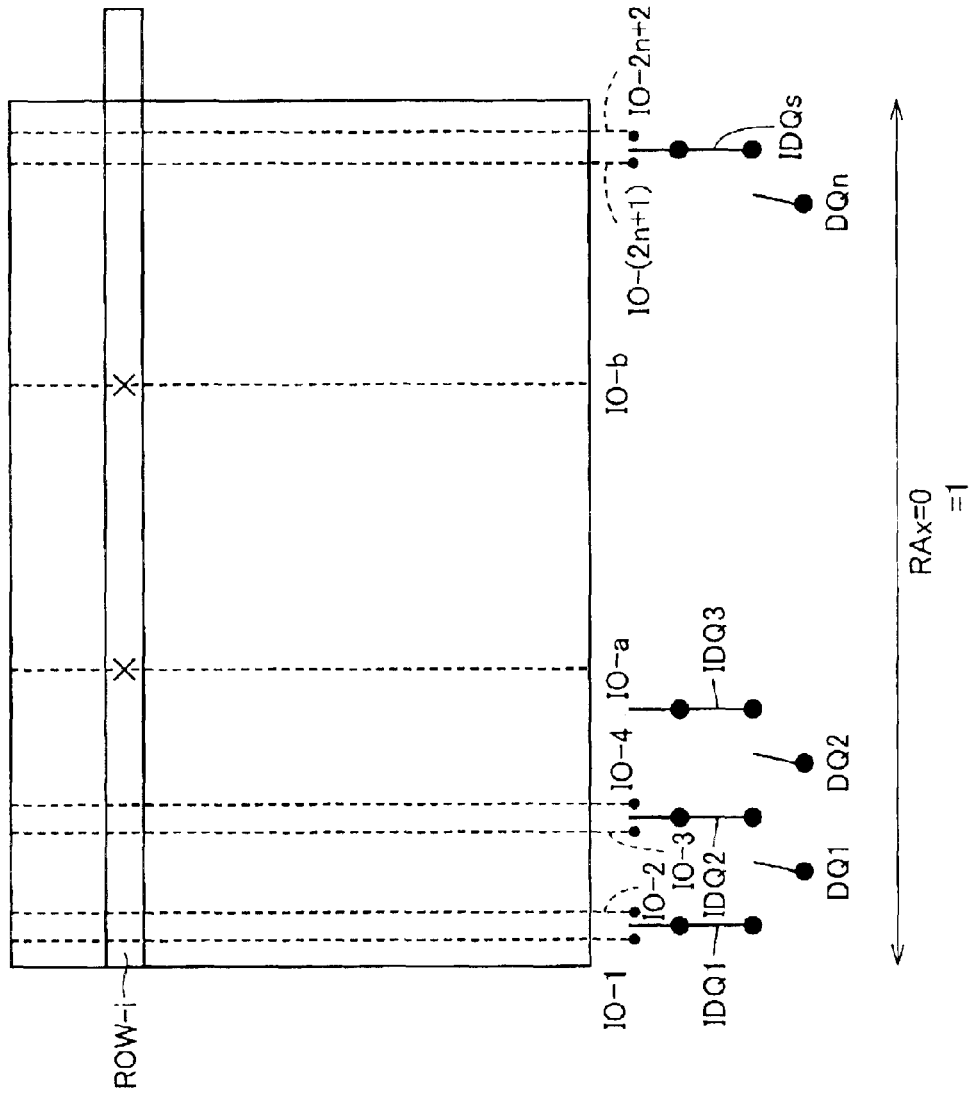
FIG. 22 is a diagram for describing generation locations of defective memory cells that can be saved in the fifth embodiment.

FIG. 22 is a diagram for describing generation locations of defective memory cells that can be saved in the fifth embodiment.

Referring to FIG. 22, description will be given of a case where two defective memory cells are present on the same memory cell row designated by row address ROW-i. In a conventional practice, defect saving was disabled in a case where IO lines IO-a and IO-b on which the defective memory cells are present are both even-numbered or odd-numbered IO lines.

However, by altering a correspondence between an IO line selected by 2-to-1 decoder 509 and an address using IOS generating circuit 504 of FIG. 20, there can be performed replacement similar to cases described in FIGS. 16 and 17.

In the fifth embodiment as well, therefore, by altering address assignment to a normal memory cell, a defect saving rate using a spare memory cell can be improved, thereby enabling improvement on product yield.

Sixth Embodiment

In a sixth embodiment, an error correction process is further added to combination of mutual address replacement between normal memory cells with replacement of a defective memory cell with a spare memory cell.

For example, as to a semiconductor memory device having an on-chip error correction function is disclosed in Japanese Patent Laying-Open No. 63-302497 and U.S. Pat. No. 4,918,692 corresponding thereto. In a semiconductor memory device having an on-chip error correction function, data group and redundant bits are collectively inputted/outputted to/from a memory cell array. Error data of 1 bit or a plurality of bits generated in the data group and redundant bit group can be automatically saved. The error data may be caused either by a defect in a memory cell or by soft error induced by incident a rays.

Since a semiconductor memory device having an on-chip error correction function requires extra memory cells corresponding to redundant bits, so much of an economical effect is not exerted in a case of a small number of bits in collectively stored data.

However, in a system LSI in recent years in which a DRAM is incorporated, a width of internal data bus is also of 128 bits or more in many of cases. If the number of bits of data stored collectively is large like this, a ratio of redundant bits to information bits in number may be small. Therefore, a semiconductor memory device having such an on-chip error correction function can be preferably used.

Figure 23:
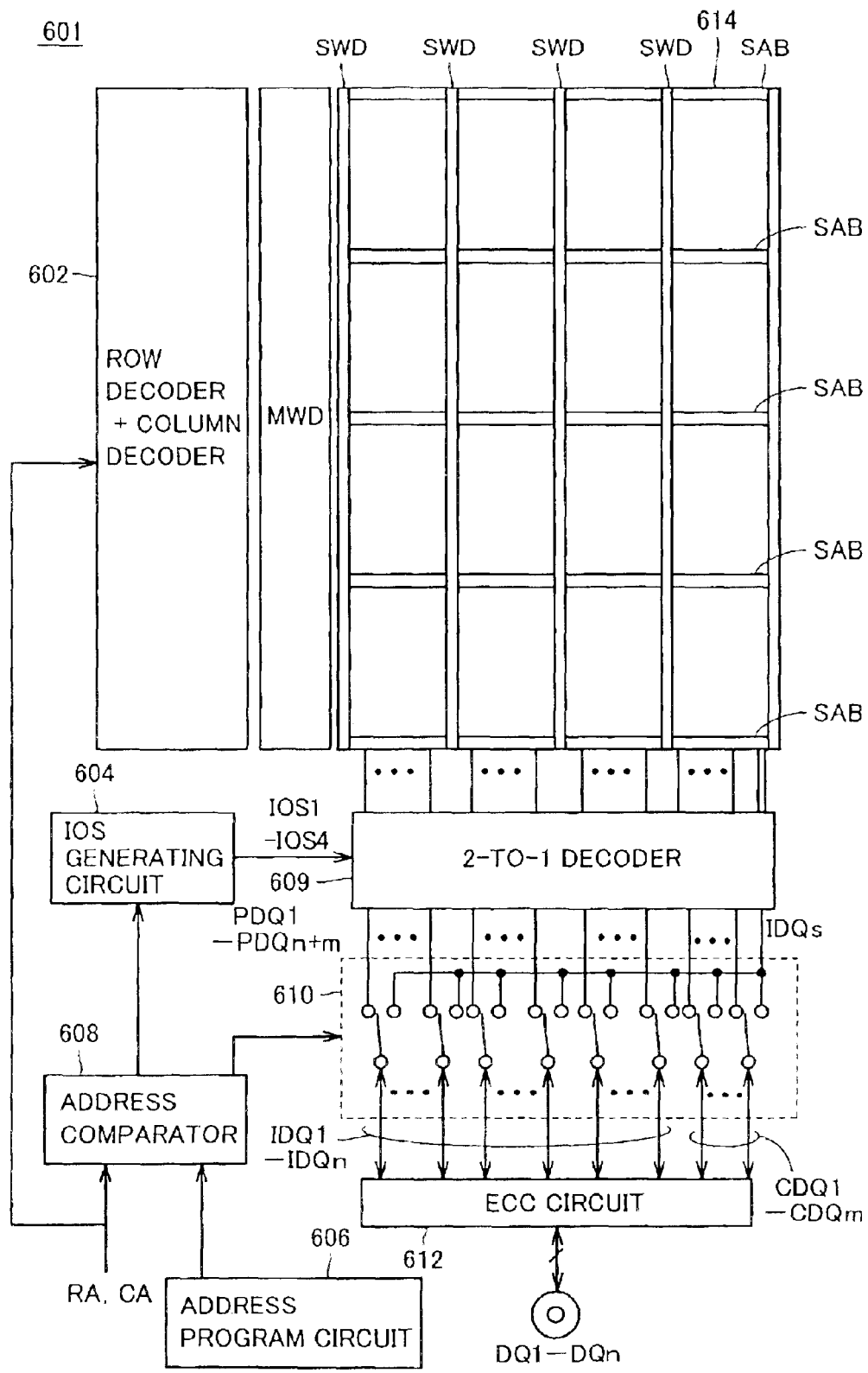
FIG. 23 is a block diagram showing a configuration of a semiconductor memory device 601 of a sixth embodiment.

FIG. 23 is a block diagram showing a configuration of a semiconductor memory device 601 of the sixth embodiment.

Referring to FIG. 23, semiconductor memory device 601 includes: an address program circuit 606 storing an address of a defective memory cell for which replacement with a spare memory cell is performed; an address comparator 608 comparing row address signal RA and a column address signal CA both inputted externally with outputs of address program circuit 606; an IOS generating circuit 604 receiving an output of address comparator 608 to generate signals IOS1 to IOS4; and a row decoder+column decoder 602 receiving row address signal RA and column address signal CA to decode the signals.

A semiconductor memory device 601 further includes: a main word driver MWD driving a main word line according to an output of row decoder+column decoder 602; and a memory cell array 614 in which a select operation is performed according to an output of row decoder+column decoder 602.

Memory cell array 614 includes a plurality of sense amplifier bands SAB and a plurality of sub-word driver bands SWD, and is divided into a plurality of memory blocks by a plurality of sense amplifier bands SAB and a plurality of sub-word driver bands SWD.

Semiconductor memory device 601 further includes: a 2-to-1 decoder 609 selecting a half of local IO lines LIO and /LIO and spare local IO lines SLIO and /SLIO onto which data is outputted from a memory cell array to connect the selected half to data lines IDQ1 to IDQn and IDQs; and a data line replacement circuit 610. Data line replacement circuit 610 includes a plurality of switches for replacing one of data lines PDQ1 to PDQn+m with spare data line IDQs.

Data line replacement circuit 610 uses spare data line IDQs when an output of address comparator 608 indicates coincidence between an address of a programmed defective memory cell and an input address.

Since the configurations of memory cell array 614 and row decoder+column decoder 602 are similar to memory cell array 214 and row decoder+column decoder 202 described in FIG. 9, neither of descriptions thereof will be repeated. Furthermore, since the configuration of 2-to-1 decoder 609 is similar to 2-to-1 decoder 309 described in FIG. 13, no description thereof will be repeated.

Semiconductor memory device 601 further includes an ECC circuit 612. When data group IDQ1 to IDQn and redundant bit group CDQ1 to CDQm are outputted from data line replacement circuit 610, ECC circuit 612 performs an error correction on the basis of the outputted data group and redundant bit group to output data signals DQ1 to DQn. On the other hand, when data signals DQ1 to DQn are given externally, ECC circuit 612 generates data group IDQ1 to IDQn and redundant bit group CDQ1 to CDQm to output the groups for writing the groups into memory cell array 614. The sum of bits included in data group IDQ1 to IDQn and redundant bit group CDQ1 to CDQm is the number of bits as a unit for error correction.

Figure 24:
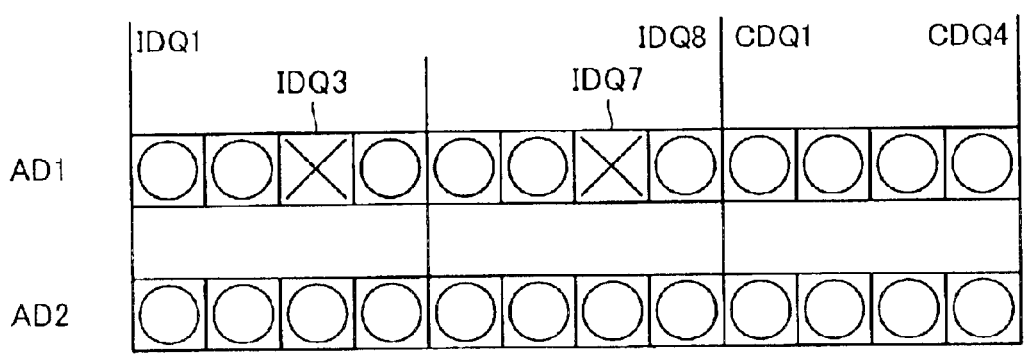
FIG. 24 is a diagram for describing locations of defects before address replacement.

FIG. 24 is a diagram for describing locations of defects before address replacement.

Referring to FIG. 24, defects are present at data bits IDQ3 and IDQ7 in an address map selected with address AD1. In such a case, saving of a defective chip is disabled if ECC circuit 612 of FIG. 23 can correct only one bit error. Furthermore, while if ECC circuit 612 can correct two bit error, it is possible to save a defective chip into a good chip with an error correction function thereof. Though, for example, in a case where soft error caused by α rays further occurs, error correction with ECC circuit 612 cannot be expected.

In such a case, if a plurality of defects can be distributed so as not to be concentrated in a portion selected by one address, soft error can be correct by ECC circuit 612 in addition to saving of a defective chip.

Figure 25:
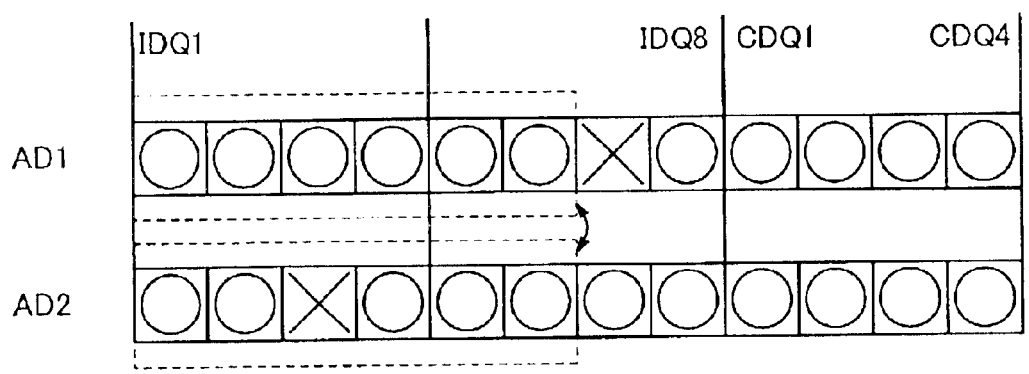
FIG. 25 is a diagram showing locations of defects for which error correction after alteration in address assignment is enabled.

FIG. 25 is a diagram showing locations of defects for which error correction after alteration in address assignment is enabled.

Referring to FIG. 25, there is performed address assignment such as that switch is made between data bits IDQ1 to IDQ6 of address AD1 and data bits IDQ1 to IDQ6 of address AD2 by IOS generating circuit 604 of FIG. 23. By doing so, if ECC circuit 612 can correct one bit error, a defective chip can be saved. Furthermore, if ECC circuit 612 can correct 2 bit error, error correction of soft error with up to one bit can be achieved. If there are many defects, it is only required that programming in address program circuit 606 is performed so as to use a spare memory cell in a memory cell array as a substitute.

As described above, a defective chip that was not saved in a conventional practice can be saved into a good chip. Furthermore, a time required for programming a defect address can also be reduced. Therefore, in the semiconductor memory device of the third embodiment as well, as compared with a conventional practice, expectation can be ensured of not only improvement on a product yield, but also reduction in fabrication cost due to reduced time required for address programming.

Seventh Embodiment

Figure 26:
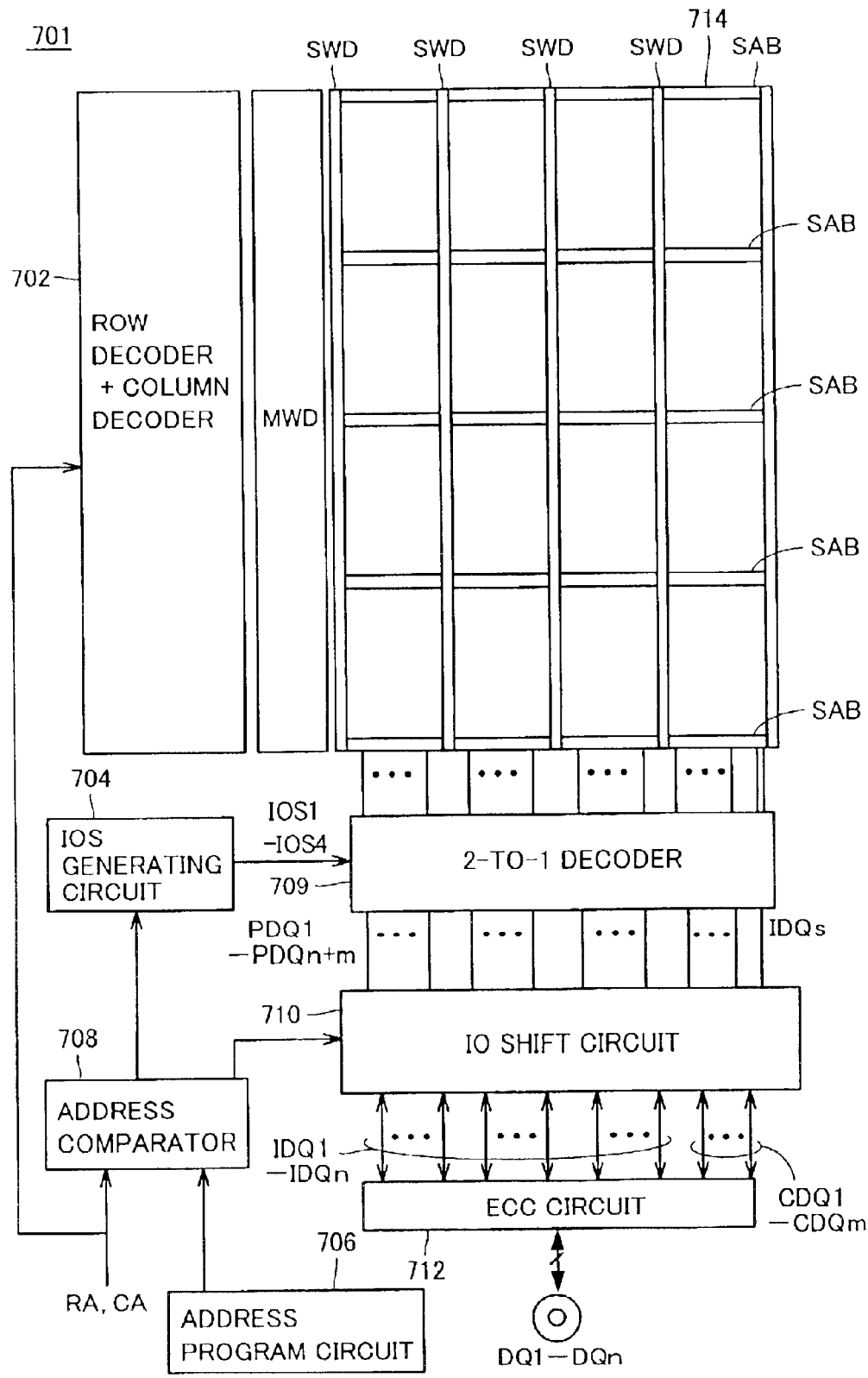
FIG. 26 is a circuit diagram showing a configuration of a semiconductor memory device 701 of a seventh embodiment.

FIG. 26 is a circuit diagram showing a configuration of a semiconductor memory device 701 of a seventh embodiment.

Referring to FIG. 26, semiconductor memory device 701 includes: an address program circuit 706 storing an address of a defective memory cell for which replacement with a spare memory cell is performed; an address comparator 708 comparing row address signal RA and column address signal CA both inputted externally to outputs of address program circuit 706; an IOS generating circuit 704 receiving an output of address comparator 708 to generate signals IOS1 to IOS4; and a row decoder+column decoder 702 receiving row address signal RA and column address signal CA to decode the signals.

Semiconductor memory device 701 further includes: a main word driver MWD driving a main word line according to an output of row decoder+column decoder 702; and a memory cell array 714 in which a select operation is performed according to an output of row decoder+column decoder 702.

Memory cell array 714 includes a plurality of sense amplifier bands SAB and a plurality of sub-word driver bands SWD, and is divided into a plurality of memory clocks by a plurality of sense amplifier bands SAB and a plurality of sub-word driver bands SWD.

Semiconductor memory device 701 further includes a 2-to-1 decoder 709 selecting a half of local IO lines LIO and /LIO and spare local IO lines SLIO and /SLIO onto which data is outputted from a memory cell array to connect the selected half to data lines IDQ1 to IDQn and IDQs.

Since the configurations of memory cell array 714 and row decoder+column decoder 702 are similar to the configurations of memory cell array 214 and row decoder+column decoder 202 described in FIG. 9, none of descriptions thereof will be repeated. Since the configuration of IOS generating circuit 704 is similar to IOS generating circuit 304 described in FIG. 14, no description thereof will be repeated. Furthermore, since the configuration of 2-to-2 decoder 709 is similar to 2-to-1 decoder 309 described in FIG. 13, no description thereof will be repeated.

Semiconductor memory device 701 further includes an IO shift circuit 710 shifting connection between data lines IDQ1 to IDQn and spare data line IDQs to terminals according to outputs of address comparator 708.

IO shift circuit 710 uses spare data line IDQs when an output of address comparator 708 indicates coincidence between a programmed address of a defective memory cell and input address.

Semiconductor memory device 701 further includes an ECC circuit 712. When data group IDQ1 to IDQn and redundant bit group CDQ1 to CDQm are outputted from IO shift circuit 710, ECC circuit 712 performs error correction on the basis of the data group and the redundant bit group to output data signals DQ1 to DQn. On the other hand, when data signal DQ1 to DQn are given externally, ECC circuit 712 generates data group IDQ1 to IDQn and redundant bit group CDQ1 to CDQm to output the groups for writing the groups into memory cell array 614.

As shown in FIG. 26, by combining IO shift circuit 710 and ECC circuit 712 with each other, more of improvement on access speed can be achieved than in the case of the sixth embodiment.

Eighth Embodiment

In the first to seventh embodiments, alteration is performed in a physical relationships in position between an address given externally and a memory cell array in the interior according to a state of the presence of defective memory cells in the memory cell array. In a case where alteration in address is performed in such a way, a problem arises that an exact test is disabled unless a correspondence between an address and a memory cell is grasped when the test is performed. The invention of an eighth embodiment is to solve such a problem.

Figure 27:
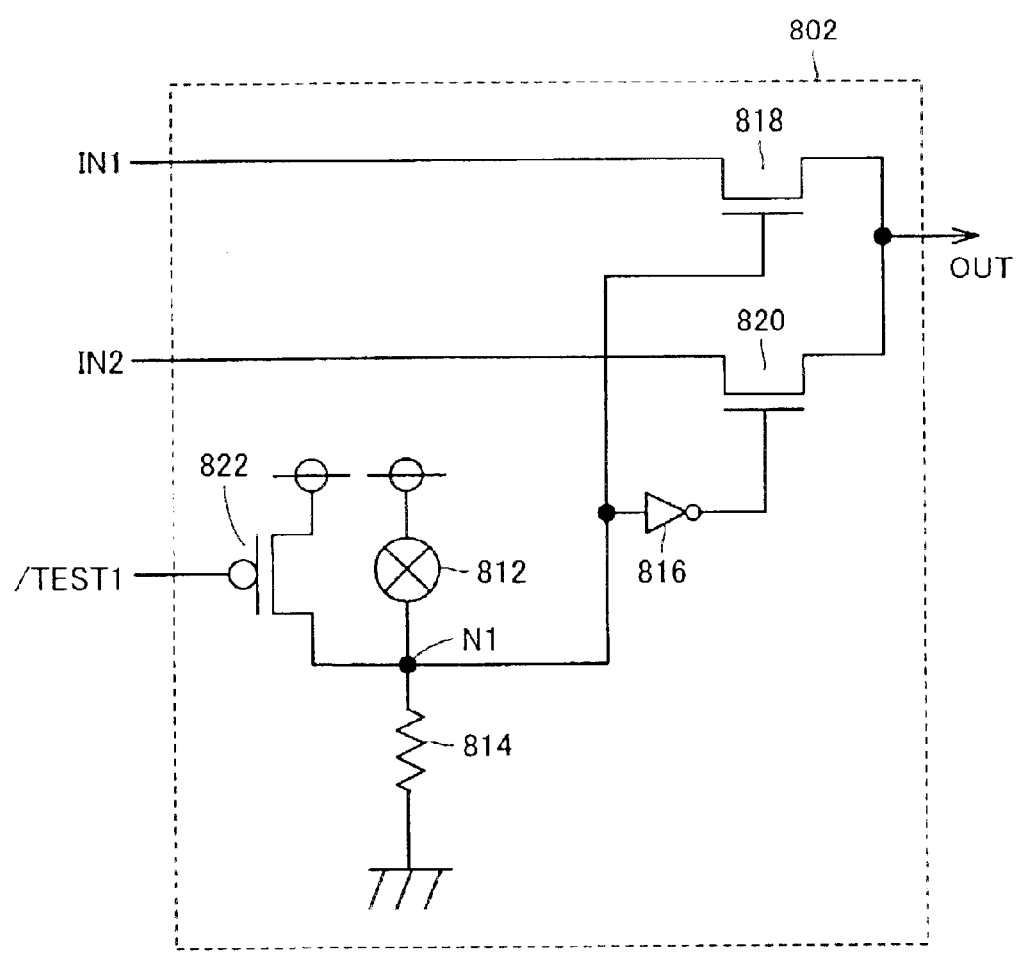
FIG. 27 is a circuit diagram showing a configuration of a switch circuit 802 used as a substitute for a switch circuit 92 shown in FIG. 4 in a semiconductor memory device of an eighth embodiment.

FIG. 27 is a circuit diagram showing a configuration of a switch circuit 802 used as a substitute for switch circuit 92 shown in FIG. 4 in a semiconductor memory device of the eighth embodiment.

Referring to FIG. 27, a switch circuit 802 includes: a fuse element 812 connected between a power supply node and node N1; a resistor 814 connected between node N1 and a ground node; an inverter 816 whose input is connected to node N1; an N-channel MOS transistor 818 connected between input node IN1 and output node OUT, and whose gate is connected to node N1; and an N-channel MOS transistor 820 connected between input node IN2 and output node OUT, and receiving an output of inverter 816 at the gate thereof.

Switch circuit 802 further includes a P-channel MOS transistor 822 connected between power supply node and node N1, and receiving a test signal /TEST1 at the gate thereof.

Then, description will be given of an operation in switch circuit 802.

In a normal mode, by disconnecting fuse element 812, address replacement between normal memory cells. At this time, test signal /TEST1 is set at H level and when fuse element 812 is disconnected, node N1 is set to L level to perform address replacement.

On the other hand, in a test mode, test signal /TEST1 is set at L level, P-channel MOS transistor 822 becomes conductive and node N1 is set at H level in a default state even in a case where fuse element 812 has been disconnected.

As described above, since, by providing switch circuit 802, an initial default state can be restored in the test mode even after address replacement is performed, an exact test can be performed in a test and it is possible that when analysis of a defective chip is performed, a correct location of a defective memory cell can also be specified.

Figure 28:
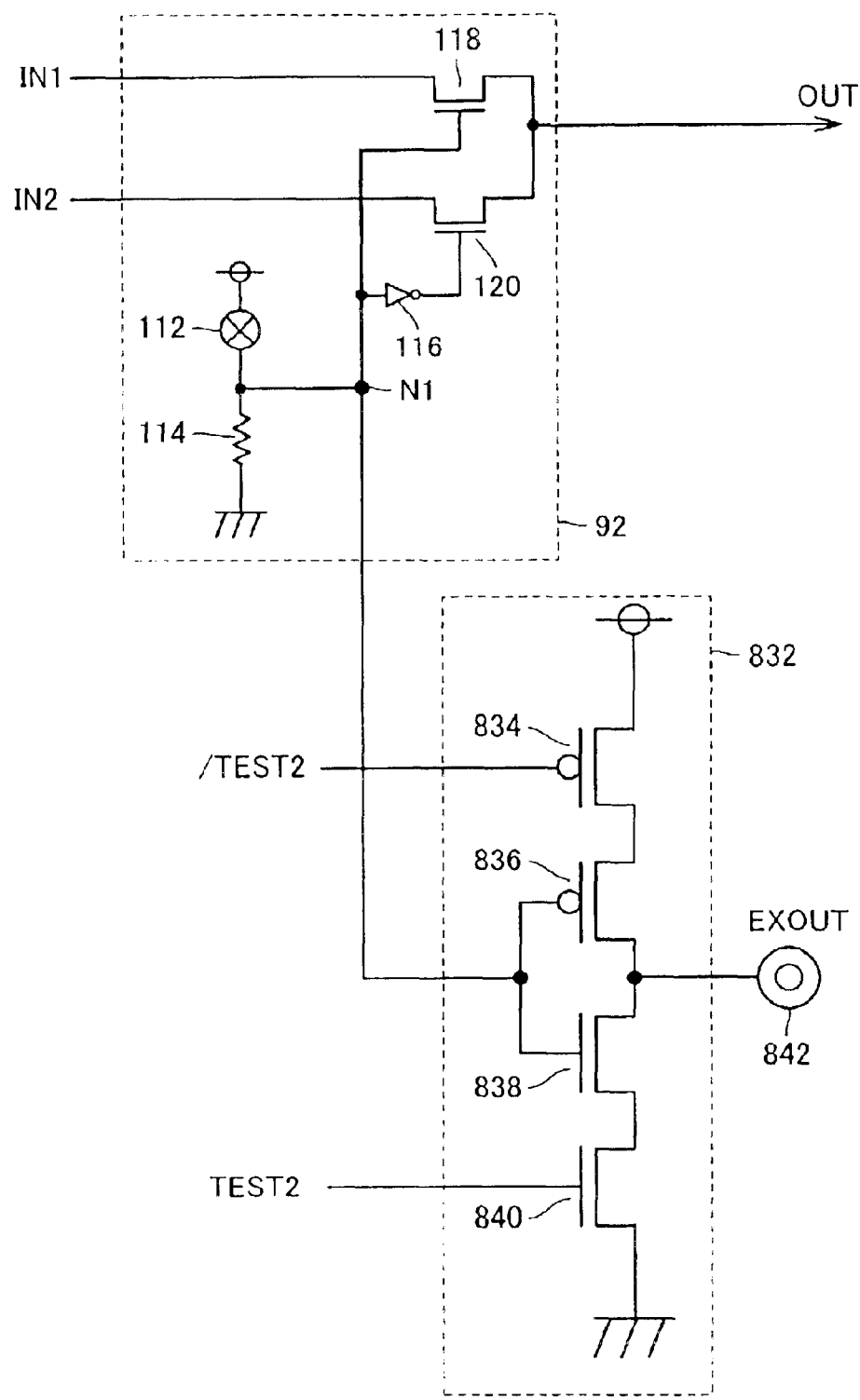
FIG. 28 is a diagram for describing a second test mode.

FIG. 28 is a diagram for describing a second test mode.

Referring to FIG. 28, a tristate inverter 832 and a terminal 842 are provided in order to output a potential at node N1 of switch circuit 92 described in FIG. 4 to outside. Tristate inverter 832 includes P-channel MOS transistors 834 and 836 and N-channel MOS transistors 838 and 840 all connected in series between power supply node and ground node.

P-channel MOS transistor 834 receives a test signal /TEST2 at the gate thereof. The gates of P-channel MOS transistor 836 and N-channel MOS transistor 838 are both connected to node N1. N-channel MOS transistor 840 receives test signal TEST2 at the gate thereof. The drain of P-channel MOS transistor 836 is connected to terminal 842.

In a test mode, test signal TEST2 is set at H level and when test signal /TEST2 is set to L level, an inverted signal of a potential at node N 1 is outputted from terminal 842 as a signal EXOUT. By monitoring signal EXOUT, it can be monitored whether or not address replacement is set in switch circuit 92. With such an operation adopted, an address program state can be grasped externally at a later timing.

Figure 29:
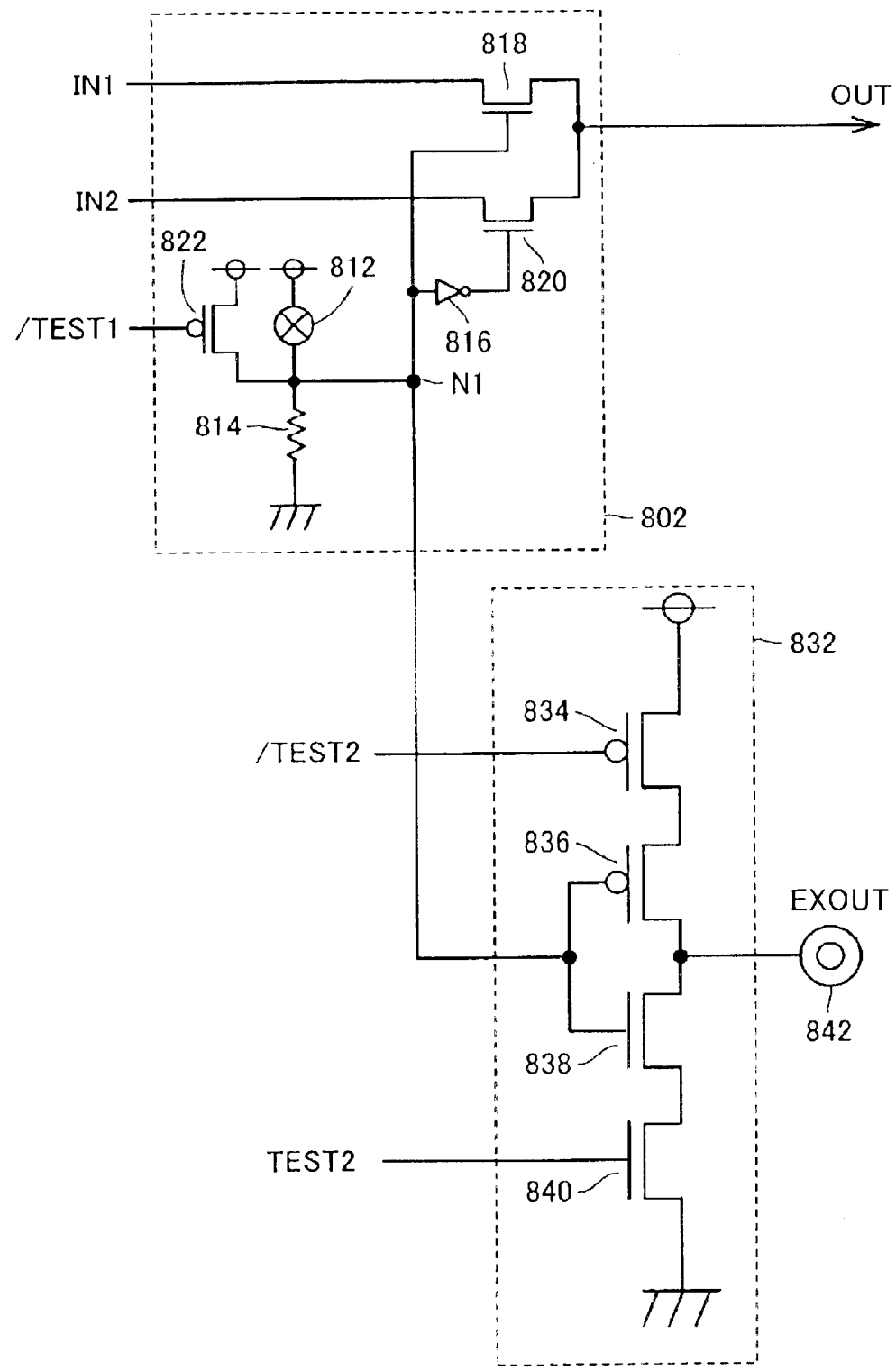
FIG. 29 is a diagram for describing an example modification, which is a combination of FIGS. 27 and 28.

FIG. 29 is a diagram for describing an example modification that is a combination of FIGS. 27 and 28.

Referring to FIG. 29, there is shown a state of combination of switch circuit 802 capable of restoring setting to a default state in a test mode with a tristate inverter 832 capable of outputting select information of switch circuit 802 to outside in a test mode. With such a configuration, an address program portion can be restored to an initial state in a first test mode where test signal /TEST1 is set at L level and in addition, a select state of switch circuit 802 can be monitored at external terminal 842 in a second test mode.

With the test mode as described above provided, a program state where mutual address replacement has been performed between normal memory cells can be restored to an original state externally. Alternatively, a setting state of address replacement can be monitored externally. Accordingly, a test is enabled in which an external input address and a physical position of a memory cell array in the interior are related with each other.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

first to fourth normal memory cell groups each including a plurality of normal memory cells;

first and second spare memory cells each for being substituted for a defective memory cell among said plurality of normal memory cells;

a first select circuit holding address assignment information in a non-volatile manner, selecting two normal memory cell groups among said first to fourth normal memory cell groups determined on the basis of said address assignment information together with said first spare memory cell in response to a first address value given as an input address, and selecting the other two normal memory cell groups among said first to fourth normal memory cell groups determined on the basis of said address assignment information together with said second spare memory cell in response to a second address value given as said input address; and a second select circuit holding replacement information in a non-volatile manner, selecting said first spare memory cell on the basis of said replacement information instead of a first defective memory cell among normal memory cells selected according to said first address value, and selecting said second spare memory cell on the basis of said replacement information instead of a second defective memory cell among normal memory cells selected according to said second address value.

2. The semiconductor memory device according to claim 1, wherein said input address is a row address given externally, and said second select circuit compares said replacement information with a column address given externally to perform a select operation.

3. The semiconductor memory device according to claim 2, further comprising:

a main word line;

a first sub-word line connected to said first normal memory cell group, and being activated in response to activation of said main word line;

a second sub-word line connected to said second normal memory cell group and said first spare memory cell, and being activated in response to activation of said main word line;

a third sub-word line connected to said third normal memory cell group, and being activated in response to activation of said main word line; and a fourth sub-word line connected to said fourth normal memory cell group and said second spare memory cell, and being activated in response to activation of said main word line, wherein said first select circuit includes a switch setting section storing, in a non-volatile manner, setting of which is performed of a first operation selecting said first and second sub-word lines collectively according to said first address value and a second operation selecting said first and fourth sub-word lines collectively according said first address value, and a drive section performing driving of said first to fourth sub-word lines selectively according to an output of said switch setting section when said main word line is activated.

4. The semiconductor memory device according to claim 1, further comprising:

first to fourth normal data line groups for performing transmission/reception of data to/from said first to fourth normal memory cell groups, respectively; and first and second spare data lines for performing transmission/reception of data to/from said first and second spare memory cells, respectively, wherein said first select circuit performs, according to said address assignment information, one of a first operation selecting said first and third normal data line groups and said first spare data line collectively according to said first address value and a second operation selecting said second and third normal data line groups and said first spare data line collectively according to said first address value, and said second select circuit compares said replacement information with said input address to select said first spare data line instead of one of a plurality of normal data lines selected collectively by said first select circuit.

5. The semiconductor memory device according to claim 4, wherein said first select circuit includes a switch setting section storing, in a non-volatile manner, setting of which is performed of a first operation in which said first and third normal data groups are selected collectively according to said first address value and in which said second and fourth normal data groups are selected collectively according to said second address value, and a second operation in which said second and third normal data groups are selected collectively according to said first address value and in which said first and fourth normal data groups are selected collectively according to said second address value, and a data line select section, according to an output of said switch setting section, selecting one of said first and second normal data line groups, selecting one of said third and fourth normal data line groups, and selecting one of said first and second spare data lines.

6. The semiconductor memory device according to claim 4, further comprising:

a plurality of external data lines respectively provided correspondingly to a plurality of normal data lines selected collectively by said first select circuit, wherein said second select circuit includes an address program circuit storing said replacement information in a non-volatile manner, an address comparator comparing said input address with an output of said address program circuit, and a data line replacement circuit connecting a spare data line selected by said first select circuit to a corresponding external data line, instead of one normal data line designated by an output of said address comparator among said plurality of normal data lines selected collectively by said first select circuit.

7. The semiconductor memory device according to claim 4, further comprising:

a plurality of external data lines respectively provided correspondingly to a plurality of normal data lines selected collectively by said first select circuit, wherein said second select circuit includes an address program circuit storing said replacement information in a non-volatile manner, an address comparator comparing said input address with an output of said address program circuit, and a data line shift circuit shifting connection of said plurality of normal data lines selected collectively by said first select circuit and a spare data line to said external data lines so that a normal data line designated by an output of said address comparator is excluded from said plurality of normal data lines selected collectively by said first select circuit.

8. The semiconductor memory device according to claim 1, further comprising an error correction circuit receiving input data given externally to generate unit data for error correction, outputting said unit data to a portion selected collectively according to said input address among said first to fourth normal cell groups and said first and second spare memory cells, and receiving said unit data read out from said portion to perform error correction and to output corrected data to outside.

9. The semiconductor memory device according to claim 1, having a normal mode and a test mode as operating modes, wherein said first select circuit includes a storage section storing said address assignment information in a non-volatile manner, and outputting said stored address assignment information in said normal mode, while outputting initial information prior to storage of said address assignment information in said test mode.

10. The semiconductor memory device according to claim 1, having a normal mode and a test mode as operating modes, and further comprising an output circuit, in said test mode, receiving said address assignment information from said first select circuit to output said address assignment information to outside.

* * * * *